(12) United States Patent
Takahashi et al.

(10) Patent No.: US 6,479,327 B2
(45) Date of Patent: Nov. 12, 2002

(54) SEMICONDUCTOR DEVICE AND METHOD FOR MANUFACTURING THE SAME

(75) Inventors: Yasushi Takahashi, Takasaki (JP); Toshinori Hirashima, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/812,592

(22) Filed: Mar. 21, 2001

(65) Prior Publication Data

US 2001/0019856 A1 Sep. 6, 2001

Related U.S. Application Data

(62) Division of application No. 09/317,853, filed on May 25, 1999, now Pat. No. 6,307,272.

(30) Foreign Application Priority Data

May 27, 1998 (JP) .......... 10-145607
Mar. 26, 1999 (JP) .......... 11-083868

(51) Int. Cl.[7] .......... H01L 21/44
(52) U.S. Cl. .......... 438/124; 257/67
(58) Field of Search .......... 438/106, 110, 438/111, 112, 121, 123, 124, 127; 257/67

(56) References Cited

U.S. PATENT DOCUMENTS

| | | | | |
|---|---|---|---|---|
| 4,032,706 A | * | 6/1977 | Paletto | 174/52 PE |
| 4,124,864 A | * | 11/1978 | Greenberg | 357/70 |
| 4,320,412 A | * | 3/1982 | Hynes et al. | 357/70 |
| 4,546,374 A | | 10/1985 | Olsen et al. | 257/878 |
| 4,916,518 A | * | 4/1990 | Yoshimura | 357/70 |
| 5,545,846 A | * | 8/1996 | Williams et al. | 174/51 |
| 5,592,019 A | * | 1/1997 | Ueda et al. | 257/666 |

FOREIGN PATENT DOCUMENTS

| | | |
|---|---|---|
| JP | 6-132468 | 5/1994 |
| JP | 6-151699 | 5/1994 |
| JP | 9-307103 | 11/1997 |

OTHER PUBLICATIONS

Hitachi Databook: Hitachi Semiconductor Package, Jul. 1997, p. 329.

Gain, Sep. 2, 1996, Hitachi Semiconductor Division, pp. 19–20.

Hybrid Packaging Technique, May 15, 1988, Industrial Research Institute, p. 25.

Electronic Systems of Automobiles, Aug. 5, 1992, Rikogakusha, pp. 110–112.

* cited by examiner

Primary Examiner—John F. Niebling
Assistant Examiner—Christopher Lattin
(74) Attorney, Agent, or Firm—Mattingly, Stanger & Malur, P.C.

(57) ABSTRACT

A package is disclosed in which deterioration of insulating encapsulation resin attributable to the generation of heat at source wires caused by an increase in a drain current is prevented. Specifically, there is provided a semiconductor package including a header made of metal, a semiconductor chip forming a power MOSFET secured on the header, an encapsulation element made of insulating resin covering the semiconductor chip, header and the like, a suspended lead contiguous with the header protruding from one side surface of the encapsulation element, a source lead and a gate lead protruding in parallel from one side surface of the encapsulation element, and wires positioned in the encapsulation element for connecting electrodes on the upper surface of the semiconductor chip and the source and gate leads. The source lead is constituted by a plurality of leads in parallel with each other, and the ends of the leads are coupled into one coupling portion in the encapsulation element. The coupling portion and the electrodes on the semiconductor chip are connected by a plurality of aluminum wires.

7 Claims, 34 Drawing Sheets

SEMICONDUCTOR DEVICE AND METHOD FOR MANUFACTURING THE SAME

This is a divisional application of U.S. Ser. No. 09/317, 853, now U.S. Pat. Ser. No. 6,307,272 filed May 25, 1999.

BACKGROUND OF THE INVENTION

1. Field of the Invention

The present invention relates to a semiconductor device manufacturing technique and, more particularly, to a technique which is advantageous when used for manufacturing semiconductor devices incorporating power supply transistors such as power MOSFETs, IGBTs (insulated gate bipolar transistors) and bipolar power transistors, i.e., for manufacturing low voltage drive power transistors through reduction of electrical resistance used in the power supplies of portable apparatuses and the like, power transistors having low thermal resistance used in the power supplies of high output apparatuses such as laser beam printers and the like and power transistors for high current used in automobile electronics.

2. Description of the Related Art

Known power supply transistors incorporated in chargers for portable telephones, video cameras and the like and in power supply circuits of office automation (OA) apparatuses and the like include low voltage drive power transistors through reduction of an on resistance (Ron). For example, a power transistor for driving at a low voltage is described in "Hitachi Databook: Hitachi Semiconductor Package" issued in July, 1997 by Semiconductor Division, Hitachi, Ltd., page 329.

This low voltage drive power transistor comprises a power MOSFET. A power MOSFET in that article has a structure in which a semiconductor chip (chip) incorporating the power MOSFET is secured on a support substrate made of metal referred to as "header"; ends of a gate lead and a source lead extending diagonally upward on the header are connected to electrodes (a gate electrode and a source electrode) on the upper surface of the chip with conductive wires; and the upper surface of the header is coated with an encapsulation element made of insulating resin to cover the chip, wires and the ends of the leads.

In such a power MOSFET, the lower surface of the header is exposed to define a radiating surface, and three leads are exposed at one side of said encapsulation element. Two of the leads are the gate and source leads, and the remaining one lead is a drain lead connected to the header. Aluminum is used for the wire connected to the source electrode, and a connection structure having two wires is used to accommodate an increased amount of current.

Further, "a power MOSFET for power management" is described in pp. 19–20 of "Gain" issued on Sep. 2, 1996 by Semiconductor Division, Hitachi, Ltd. This power MOSFET is described as being primarily used for chargers of portable telephones, video cameras and the like and for power management during the charging and discharging of lithium ion secondary batteries such as power supplies of OA apparatuses and notebook type personal computers.

Furthermore, Japanese Patent Laid-Open No. 307103/1997 (Japanese Patent Application No. 120211/1996) discloses a technique for a composite power MOSFET incorporating a negative voltage protection circuit for preventing any breakdown of the element attributable to a negative voltage applied to the drain.

As described in "Hybrid Packaging Technique" issued on May 15, 1988 by Industrial Research Institute, page 25, power transistors are widely used in power supplies for driving motors to operate devices in various parts of an automobile. A hydraulic pump system driven by an electric motor and power steering driven by an electric motor itself are described in "Electronic Systems of Automobiles" issued on Aug. 5, 1992 by Rikogakusha, pp. 110–112.

SUMMARY OF THE INVENTION

For example, a power MOSFET is used by incorporating it in a rectifier circuit of a power supply of an OA apparatus. While rectifier circuits have conventionally employed diodes, power MOSFETs have recently come into use because of their low on resistance.

The reduced on resistance has resulted in a trend toward power MOSFETs having higher output. Further, the progress of fine processing techniques in the manufacture of semiconductor devices has resulted in power MOSFETs having higher characteristics and, for example, MOSFETs having an on resistance of about 0.34 m$\Omega$ (when they are in the form of semiconductor chips) have been developed.

The inventors have developed this time a semiconductor device (resin-encapsulated semiconductor device) in a configuration of a power MOSFET having an output as high as 500 W (5V, 100 A) and have found that following problems can occur as a result of an examination of conventional structures including configurations of encapsulation elements (packages).

In conventional resin-encapsulated semiconductor devices, wires having large diameters are used to provide high output, and two wires are used. While gold wires are desirable because of their low resistance, aluminum is used because of the high cost of gold. Aluminum is connected to electrodes and leads by means of wire bonding utilizing ultrasonic oscillation (USWB) and is formed to have a maximum diameter of 500 $\mu$m. This is the maximum dimension of aluminum wires available on the market which is used here because custom-made parts are expensive.

When aluminum wires having a diameter of about 500 $\mu$m or more are used, a wire bonding apparatus utilizing ultrasonic oscillation can damage semiconductor chips formed from fragile semiconductors such as silicon, and it is therefore limited to the use of aluminum wires having a diameter of about 500 $\mu$m. Further, aluminum wires having a thickness in the excess of 500 $\mu$m are unsuitable for use because they can be cracked or cut when wound around a spool. This problem becomes more serious, the higher the purity of aluminum. Aluminum having high purity is used for wire bonding.

In addition, the output of conventional semiconductor devices in the form of power MOSFETs has been in the range from about 200 to 300 W at the maximum, which is quite small in comparison to 500 W which is achieved this time.

When two aluminum wires having a diameter of 500 $\mu$m are used, a great amount of heat is generated at the region of the wires, which can deteriorate resin (epoxy resin) having a glass transition temperature (Tg) in the range from about 155 to 170° C.

In consideration to this, the inventors examined increase of the number of wires used. According to a study carried out by the inventors, in conventional power MOSFET encapsulating structures, no consideration is paid on heat radiation from a source lead.

In the field of automobiles, while a compressor for power steering has conventionally been driven by a fan belt, there is a trend toward motor-driven systems (hydraulic pump type electric power steering) to reduce the weight of vehicle bodies and fuel consumption.

Further, systems for driving steering directly without a pump (directly driven electric power steering) have come in use in small cars to achieve a further reduction of weight.

Both of the systems described above employ a high current transistor (semiconductor device). For example, hydraulic pump type electric power steering and directly driven electric power steering require currents of 120 A and 70 A, respectively.

Especially, in Europe where regulations exist to prevent electric wave interference, motors must be of the brushless type, and the maximum torque of directly driven electric power steering is determined by the current which is allowed to flow through the transistor, e.g., MOSFET; incorporated in the driving system for the same. This factor consequently determines the total stroke of volume of the cars in which the steering system can be used.

It is assumed that existing transistors in TO220 type packages is limited to use in cars having total stroke volumes up to about 1500 cc because they can only carry a current of about 75 A.

Furthermore, transistors are incorporated in the engine room in an automobile where they can be subjected to a high temperature and are thus used in a severe environment in terms of temperature. Referring to a value as a result of an experiment by the inventors, when a current of 110 A is applied to two wires having a diameter of 500 $\mu$m used in a package having an external configuration of TO220AB to connect a source electrode and a source lead, the temperature around the wires rises to 151.5° C. (in an ambient temperature of 80° C.).

Under such circumstances, in order to improve heat radiating properties of a transistor, a need arises for semiconductor device packaging in which a header carrying a semiconductor chip is directly secured to a heat sink or the like. In this case, it may not be possible to use the header as an electrode lead terminal. In such a case, leads to serve as a drain, source and gate are required as electrode terminals from a package.

It is an object of the invention to provide a semiconductor device (a low voltage drive power transistor, a power transistor for a high current or the like) having a high output in which no deterioration is caused on the encapsulation element due to the generation of heat.

The above and other object and novel features of the invention will be apparent from the description of the present specification and the accompanying drawings.

Typical aspects of the invention disclosed in this specification can be briefly summarized as follows.

(1) There is provided a semiconductor device comprising:

an encapsulation element (a sealing body) made of insulating resin;

a support substrate made of metal covered at least in a part thereof by the encapsulation element and uncovered by the encapsulation element at a lower surface thereof which is to serve as a first electrode;

a suspended lead contiguous with the support substrate protruding from one side surface of the encapsulation element;

a second electrode lead to serve as a second electrode and a control electrode lead to serve as a control electrode protruding in parallel from the side surface of the encapsulation element;

a semiconductor chip covered by the encapsulation element and having the first electrode on a lower surface thereof and the second electrode and control electrode on an upper surface thereof, the lower surface being secured to the support substrate through a conductive bonding material; and wires provided in the encapsulation element for establishing electrical connection between the second electrode and second electrode lead and between the control electrode and control electrode lead. The second electrode lead comprises a plurality of leads in parallel with each other which are coupled to one coupling portion in the encapsulation element at the ends thereof. The coupling portion and the second electrode of the semiconductor chip are connected to each other by a plurality of wires in parallel with each other. The control electrode lead and second electrode lead protruding from one side surface of the encapsulation element are bent in the middle thereof to provide a structure for surface mounting. The wires comprise aluminum wires, and the number of the wires connecting the second electrode lead and second electrode is three or more (four). The semiconductor chip comprises any of a power MOSFET, a power bipolar transistor or an IGBT whose electrodes are the first electrode (drain electrode), second electrode (source electrode) and control electrode (gate electrode). For example, it comprises a power MOSFET. The control electrode lead and second electrode lead protruding from one side surface of the encapsulation element may be extended straightly to provide a structure for insertion mounting. While the suspended lead is an unused lead which is cut in the vicinity of the encapsulation element, it may be configured in a structure for surface mounting or insertion mounting to be used as a lead for the first electrode.

Such a semiconductor device is manufactured according to a method as described below.

There is provided a method for manufacturing a semiconductor device, comprising the steps of:

providing a support substrate comprising a sheet of metal patterned and bent in a part to form a step, which forms a first electrode and to which a semiconductor chip is secured and providing a lead frame comprising a suspended lead for supporting the support substrate at both side thereof and second electrode lead and a control electrode lead extending in parallel with the suspended lead;

providing a semiconductor chip having a first electrode on a lower surface thereof and a second electrode and a control electrode on an upper surface thereof;

securing said semiconductor chip to the support substrate at the region of the first electrode thereof through a conductive bonding material;

establishing connection between the second electrode of the semiconductor chip and a wire connection portion of the second electrode lead and between the control electrode of the semiconductor chip and a wire connection portion of the control electrode lead with conductive wires;

molding the semiconductor chip, the connection means and a part of the second electrode lead and the control electrode lead in insulating resin to cover them with an encapsulation element; and cutting and removing an unnecessary part of the lead frame and forming the leads into a structure for insertion mounting or surface mounting, wherein the second electrode lead is configured in a wide structure wider than the width of the control electrode lead or is constituted by a plurality of leads coupled at a coupling portion in the encapsulation element;

the semiconductor chip is thereafter secured on to the support substrate; and connection is thereafter established between the second electrode of the semiconductor chip and the end of the second electrode lead having a wide structure or between the second electrode and the coupling portion with a plurality of wires.

The suspended lead is cut in the vicinity of the encapsulation element or is formed into a structure for surface mounting or insertion mounting which allows itself to be used as a lead for the first electrode. A semiconductor chip having a power MOSFET whose electrodes are constituted by the first electrode, second electrode and control electrode is secured on the support substrate, and the second electrode lead and the second electrode are connected with three or more (e.g., four) conductive wires.

(2) In the configuration according to the first aspect, the second electrode lead constituted by a plurality of leads has a wide structure in which the leads are coupled to each other with a link piece in a region outside the encapsulation element. An inserting portion in the form of a protrusion for insertion mounting is formed at the ends of the leads outside the link piece.

In such a semiconductor device according to the method for manufacture in the first aspect, the second electrode lead is formed by a plurality of leads extending in parallel with each other, and the leads are linked to each other by a linking piece in a region outside said encapsulation element.

(3) There is provided a semiconductor device comprising:

an encapsulation element made of insulating resin;

a support substrate made of metal covered at least in a part thereof by the encapsulation element and uncovered by the encapsulation element at a lower surface thereof which is to serve as a first electrode;

a suspended lead contiguous with the support substrate protruding from one side surface of the encapsulation element;

a second electrode lead to serve as a second electrode and a control electrode lead to serve as a control electrode protruding in parallel from the one side surface of the encapsulation element;

a semiconductor chip covered by the encapsulation element and having a first electrode on a lower surface thereof and a second electrode and a control electrode on an upper surface thereof, the lower surface being secured to the support substrate through a conductive bonding material; and wires positioned in the encapsulation element for establishing electrical connection between the second electrode and the second electrode lead and between the control electrode and the control electrode lead, wherein at least the width of a wire connection portion of the second electrode lead to which wires are connected is greater than the width of a wire connection portion of the control electrode lead. The lead portion of the second electrode lead excluding the wire connection portion has a width equal to or greater than the width of the control electrode lead. When the second electrode lead has a wide structure which is to be bent, one or a plurality of holes for uniform bending are provided in a bent portion of the second electrode lead to bend and shape the lead uniformly. A machine screw mounting hole is provided in a mounting region of the second electrode lead. An inserting portion for insertion mounting is formed to protrude from the end of the lead to provide a structure that also allows insertion mounting.

In such a semiconductor device according to the method for manufacture in the first aspect, the second electrode lead of the lead frame is formed such that at least the wire connection portion of the second electrode lead has a width greater than the width of the wire connection portion of the control electrode lead. The second electrode lead is formed wider than the width of the control electrode lead, and the second electrode lead used has one or a plurality of holes for uniform bending at a bent region thereof.

(4) There is provided a semiconductor device comprising:

an encapsulation element made of insulating resin;

a support substrate made of metal covered at least in a part thereof by the encapsulation element and uncovered by the encapsulation element at a lower surface thereof which is to serve as a first electrode;

a second electrode lead to serve as a second electrode and a control electrode lead to serve as a control electrode protruding in parallel from the one side surface of the encapsulation element;

a semiconductor chip covered by the encapsulation element and having a first electrode on a lower surface thereof and a second electrode and a control electrode on an upper surface thereof, the lower surface being secured to the support substrate through a conductive bonding material; and wires positioned in the encapsulation element for establishing electrical connection between the second electrode and the second electrode lead and between the control electrode and the control electrode lead, wherein the second electrode lead has a structure in which the width of a wire connection portion thereof lead to which wires are connected is greater than the width of a wire connection portion of the control electrode lead and in which a plurality of leads extend from the wire connection portion in parallel with each other. Other parts are in the same configuration as in the first aspect.

Such a semiconductor device is manufactured according to the method described below.

There is provided a method for manufacturing a semiconductor device, comprising the steps of:

providing a support substrate comprising a sheet of metal patterned and bent in a part to form a step, which forms a first electrode and to which a semiconductor chip is secured and providing a lead frame comprising a second electrode lead and a control electrode lead extending in parallel toward one end face of the support substrate and a suspended lead for supporting the support substrate at the end thereof on both sides of the support substrate intersecting with one end face thereof;

providing a semiconductor chip having a first electrode on a lower surface thereof and a second electrode and a control electrode on an upper surface thereof;

securing the semiconductor chip to the support substrate at the region of the first electrode thereof through a conductive bonding material;

establishing connection between the second electrode of the semiconductor chip and the second electrode lead and between the control electrode and the control electrode lead with conductive wires;

molding the semiconductor chip, the connection means and a part of the second electrode lead and the control electrode lead in insulating resin to cover them with an encapsulation element; and cutting and removing an unnecessary part of the lead frame and forming the leads into a structure for insertion mounting or surface mounting, wherein the second electrode lead is configured in a wide structure wider than the width of the control electrode lead or is constituted by a lead which is wider in a wire connection portion thereof than a wire connection portion of the control electrode lead or by a plurality of leads extending from the wire connection portion;

the semiconductor chip is thereafter secured on to the support substrate; and connection is thereafter established between the second electrode of the semiconductor chip and the end of the second electrode lead having a wide structure or between the second electrode and the coupling portion with a plurality of wires.

(5) In the configuration according to the first or fourth aspect, the coupling portion or wire connection portion is formed by a plurality of conductor portions each of which is electrically separated, and at least one lead extends from each of the conductor portions. Other parts are in the same configuration as in the first aspect.

Such a semiconductor device utilizes a lead frame as described below. The wire connection portion is formed by a plurality of conductor portions each of which is electrically separated, and each of the conductor portions is formed such that it is connected to any of the leads.

(6) There is provided a semiconductor device comprising:
an encapsulation element made of insulating resin;
a support substrate made of metal covered at least in a part thereof by the encapsulation element and uncovered by the encapsulation element at a lower surface thereof which is to serve as a first electrode;

a second electrode lead to serve as a second electrode and a control electrode lead to serve as a control electrode protruding in parallel from the one side surface of the encapsulation element;

a semiconductor chip covered by the encapsulation element and having a first electrode on a lower surface thereof and a second electrode and a control electrode on an upper surface thereof, the lower surface being secured to the support substrate through a conductive bonding material; and wires positioned in the encapsulation element for establishing electrical connection between the second electrode and the second electrode lead and between the control electrode and the control electrode lead, wherein the width of a wire connection portion of the second electrode lead to which wires are connected is greater than the width of a wire connection portion of the control electrode lead. The width of the second electrode lead is equal to or greater than the width of the control electrode lead. Other parts are in the same configuration as that in the first aspect.

(7) In the configuration according to any of the first through sixth aspects, the end of the coupling portion or wire connection portion of the second electrode lead and the control electrode lead is exposed or protrudes from a side of the encapsulation element. In this example, during the manufacture of the semiconductor device, the end of the coupling portion or wire connection portion of the second electrode lead and the control electrode lead is formed such that it is exposed or protrudes from a side of the encapsulation element.

(8) In the configuration according to any of the first through seventh aspects, the intervals between the leads including the second electrode lead and control electrode lead are constant.

(9) In the configuration according to any of the first through seventh aspects, the intervals between the leads including the second electrode lead and control electrode lead are different at least in a part.

(10) In the configuration according to any of the first through ninth aspects, the second electrode lead is located in the center or close to the center.

(11) In the configuration according to any of the first through tenth aspects, the position of the leads as a whole is biased toward one side of the encapsulation element.

(12) In the configuration according to any of the first through eleventh aspects, a mounting hole is provided in a region of the support substrate that protrudes from the encapsulation element.

(13) In the configuration according to any of the first through eleventh aspects, the region of the support substrate protruding from the encapsulation element is on the order of several millimeters.

According to the first aspect, (a) the heat transfer effect is improved because the second electrode lead is constituted by two leads in parallel with each other.

(b) Since the leads apart from each other are connected to one coupling portion inside, the coupling portion is long enough to allow three or more wires, i.e., four wires to be connected thereto. As a result, the amount of current that flows through one wire is smaller than that in a conventional two line configuration. This makes it possible to suppress the amount of heat generated even at a high source-drain current sufficiently below the glass transition temperature of the resin that constitutes the encapsulation element, thereby preventing the deterioration of the resin. When the source electrode and the source lead are connected by four aluminum wires (having a diameter of 500 $\mu$m and a length of 6.0 mm), power loss is on the order of 2.3 W against power of 500 W (5 V, 100 A), which prevents the deterioration of resin.

(c) Heat at the surface of the semiconductor chip is transferred through the four wires and the source lead that provides a high heat transfer effect to a printed circuit board, which allows a stable operation of the semiconductor device.

(d) The control electrode lead and second electrode lead can be straightly extended to provide a structure for insertion mounting. Further, while the suspended lead is cut in the vicinity of the encapsulation element to be an unused lead, it may be formed into a structure for surface mounting and insertion mounting to be used as a lead for the first electrode.

According to the second aspect, in addition to the effects of the first aspect, (a) even when two leads are used, they will be in a wide structure in which they are linked to each other by a linking piece in regions outside the encapsulation element and, as a result, the heat transfer effect is improved to improve the effect of heat radiation at the source electrode.

(b) Since an inserting portion for insertion mounting is provided at the ends of the leads outside the region of the linking piece, the use of the inserting portion allows insertion mounting to provide a type that accommodate both of surface mounting and insertion mounting.

According to the third aspect, in addition to the effect of the first aspect, (a) since the single second electrode lead is wide enough, the heat transfer effect is further improved to contribute to a stable operation of a power MOSFET.

(b) During the manufacture of the semiconductor device, the second electrode lead having a wide structure on the lead frame is formed with a hole for uniform bending to allow it to be bent and shaped uniformly, and the width of each bent portion is equal to or smaller than the width of the control electrode lead. This improves lead shapability and yield.

(c) Since the mounting portion of the second electrode lead can be secured to a printed circuit board with a machine screw using the machine screw mounting portion, the lead can be secured with increased strength and can be directly secured to a printed circuit board. This improves the heat transfer effect and contributes to a stable operation of a power MOSFET.

(d) An insertion portion in the form of a protrusion is formed at the end of the lead to allow insertion mounting, which allows it to accommodate both of surface mounting and insertion mounting.

According to the fourth aspect, four thick wires (having a diameter of 500 $\mu$m) can be connected to the wire connection portion of the second electrode lead as in the configuration according to the first aspect even in a structure in which the support substrate is not supported by a suspended lead. This makes it possible to suppress the amount of heat generated at the wires and to prevent damage attributable to heat at the encapsulation element. Further, since the second electrode lead is constituted by a plurality of leads, it is possible to improve the effect of radiating heat through the lead to the outside of the encapsulation element, thereby allowing a stable operation of the semiconductor device to be maintained.

According to the fifth aspect, the suppression of thermal damage to the encapsulation element through the use of four wires having a diameter of 500 $\mu$m and the stable operation of the semiconductor device through thermal diffusion at the plurality of leads can be achieved as in the first aspect even in a structure in which the coupling portion and wire connection portion are separated.

According to the sixth aspect, since four wires having a diameter of 500 $\mu$m can be connected to the wire connection portion of the second electrode lead, the generation of heat can be suppressed to suppress thermal damage to the encapsulation element. Further, in the case of a wide lead, since heat can be effectively transferred through the lead, it is possible to improve radiation characteristics and to achieve a stable operation of the semiconductor device.

According to the seventh aspect, in addition to the effects of the configurations of the first through sixth aspects, since the end of the coupling portion or wire connection portion of the second electrode lead and the control electrode lead is exposed or protrudes from a side of the encapsulation element, the width of the coupling portion or wire connection portion of the second electrode lead can be increased to improve flexibility of wire bonding or to increase the number of wires connected thereto.

According to the eighth aspect, in addition to the effects of the configuration of any of the first through seventh aspects, since the intervals between the leads are constant, it is easy to provide a product that complies relevant specifications.

According to the ninth aspect, in addition to the effects of the configuration of any of the first through seventh aspects, since there is provided a configuration in which the intervals between the leads are different at least in a part, it is easy to provide a product that complies relevant specifications.

According to the tenth aspect, in addition to the effects of the configuration of any of the first through ninth aspects, since the second electrode lead is positioned in the center or close to the center, the length of the wires connected to the wire connection portion of the second electrode lead can be reduced to provide an effect of suppressing the generation of heat further through a reduction of resistance.

According to the eleventh aspect, in addition to the effects of the configuration of any of the first through tenth aspects, since the position of the leads as a whole is biased toward one side of the encapsulation element, the position of the encapsulation element can be biased during the mounting of the semiconductor device.

According to the twelfth aspect, in addition to the effects of the configuration of any of the first through eleventh aspects, the support substrate can be secured in tight contact with a predetermined position with a machine screw or the like using a mounting hole provided on the support substrate. This allows radiation of heat through the support substrate. In a structure in which a radiation fin is secured to the support substrate, radiation of heat from the radiation fin can be effectively achieved.

According to the thirteenth aspect, in addition to the effects of the configuration of any of the first through eleventh aspects, it is possible to provide a product in compliance with specifications such as TO-263AA and TO-263AB in which the support substrate does not protrude from the encapsulation element in a large amount.

DESCRIPTION OF THE PREFERRED EMBODIMENTS

Preferred embodiments of the invention will now be described in detail with reference to the accompanying drawings. In all of the drawings to illustrate preferred embodiments of the invention, like reference numbers are assigned to parts having like functions to avoid repeated description.

A first embodiment of the invention will now be described.

Figure 3:
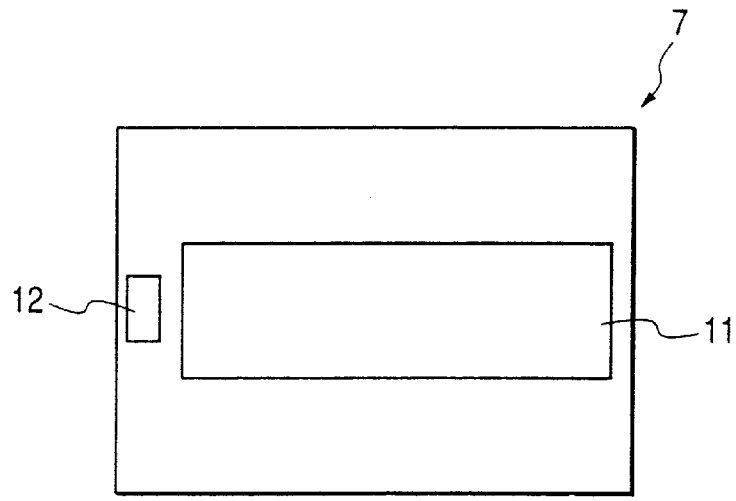
FIG. 3 is a schematic plan view of a semiconductor chip incorporated in the semiconductor device of the first embodiment.
Figure 4:
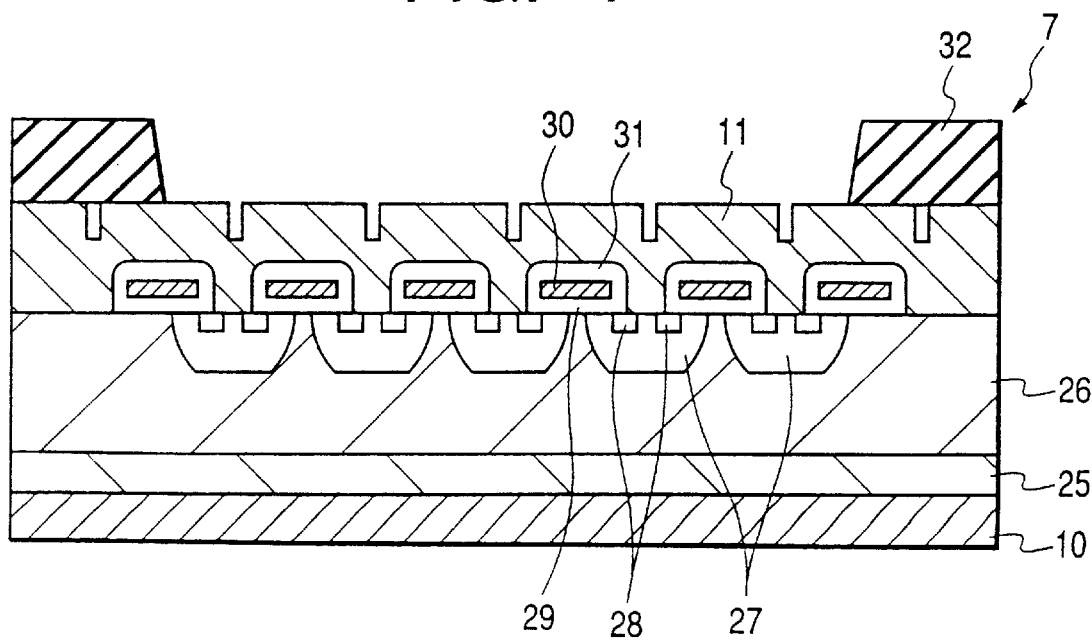
FIG. 4 is a schematic sectional view of the semiconductor chip.
Figure 5:
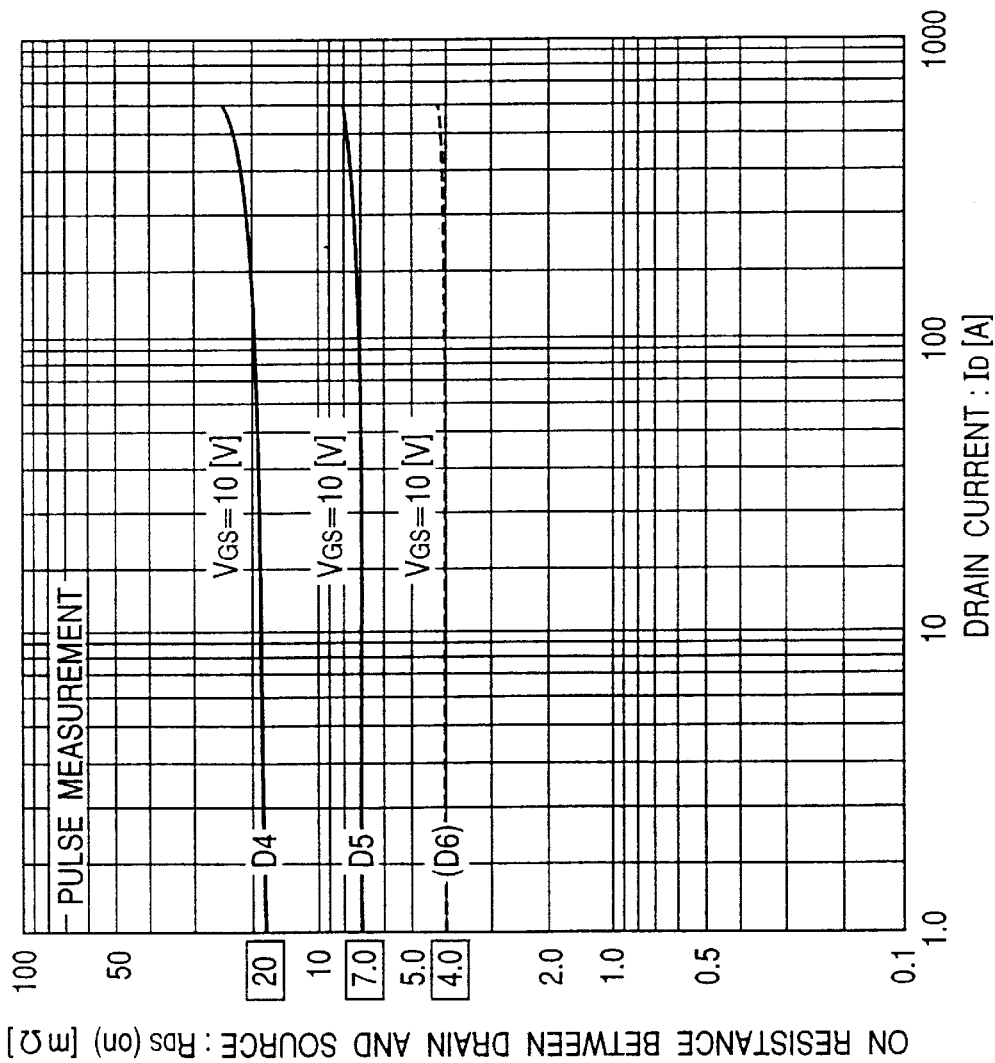
FIG. 5 is a graph showing the characteristics of a power MOSFET incorporated in the semiconductor chip.
Figure 6:
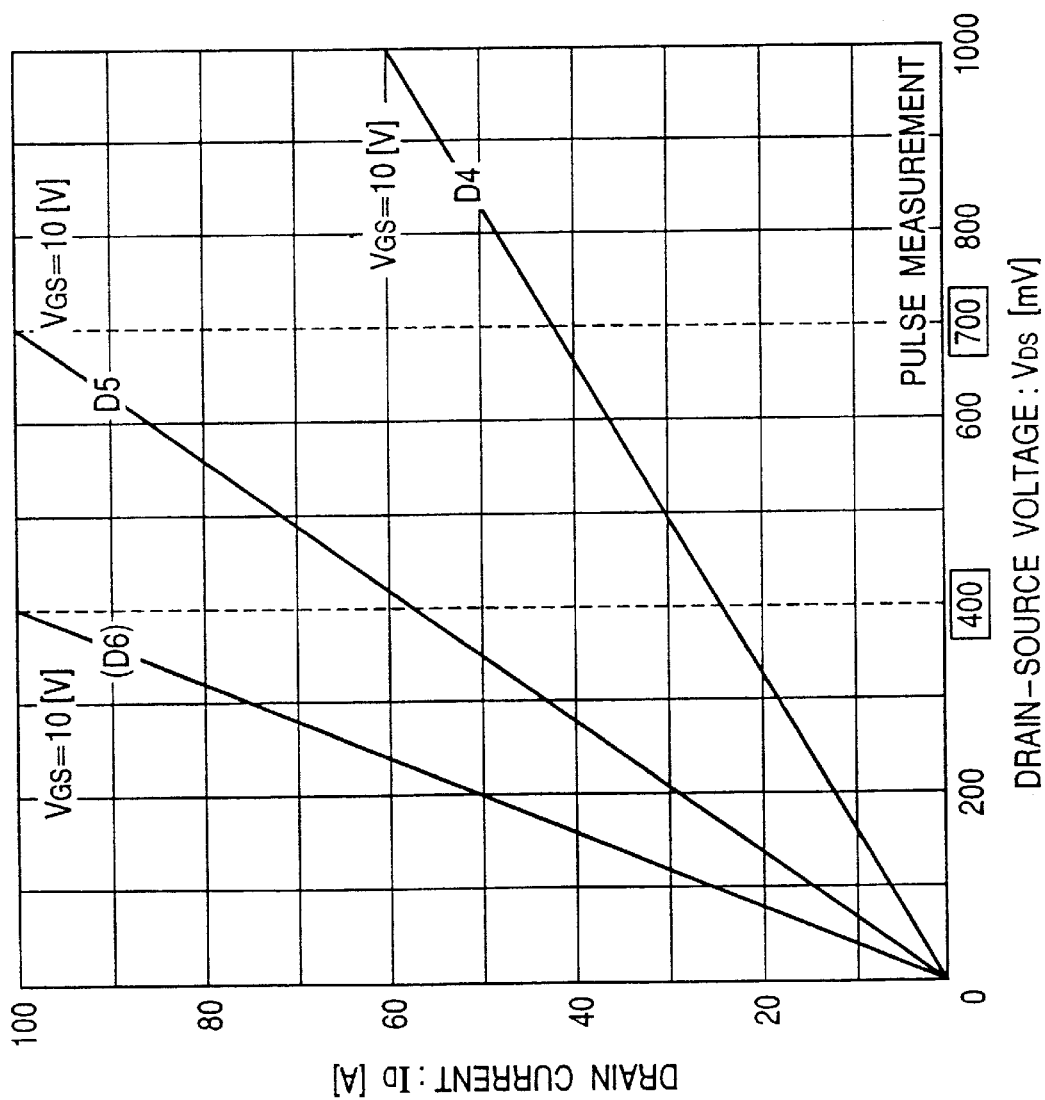
FIG. 6 is a graph showing the characteristics of a power MOSFET incorporated in the semiconductor chip.

FIGS. 1 through 14 are views related to a semiconductor device (low voltage drive power transistor) which is a first embodiment of the invention. FIGS. 1 through 4 are views related to a structure of the semiconductor device of the first embodiment; FIGS. 5 and 6 are graphs showing electrical characteristics of the same; FIGS. 7 through 14 are views related to a method for manufacturing the semiconductor device; and FIG. 15 is a diagram of a rectifier circuit incorporating the semiconductor device of the first embodiment.

Figure 1:
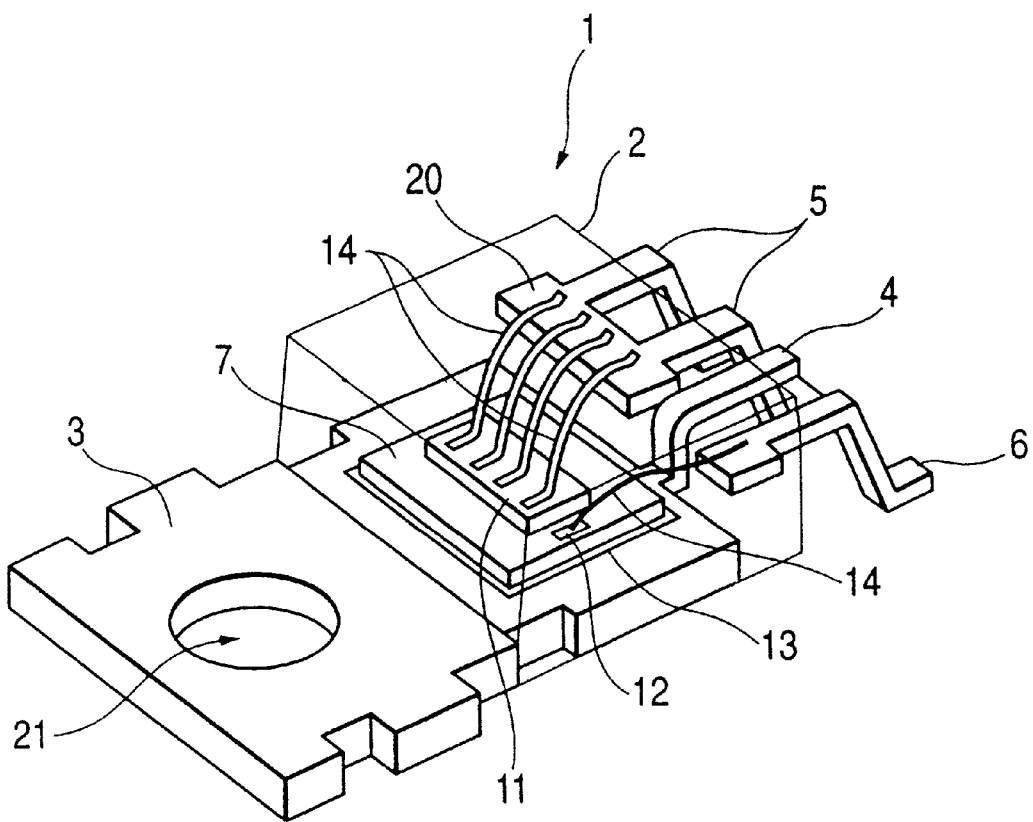
FIG. 1 is a schematic perspective view of a semiconductor device which is an embodiment of the invention (first embodiment).
Figure 2:
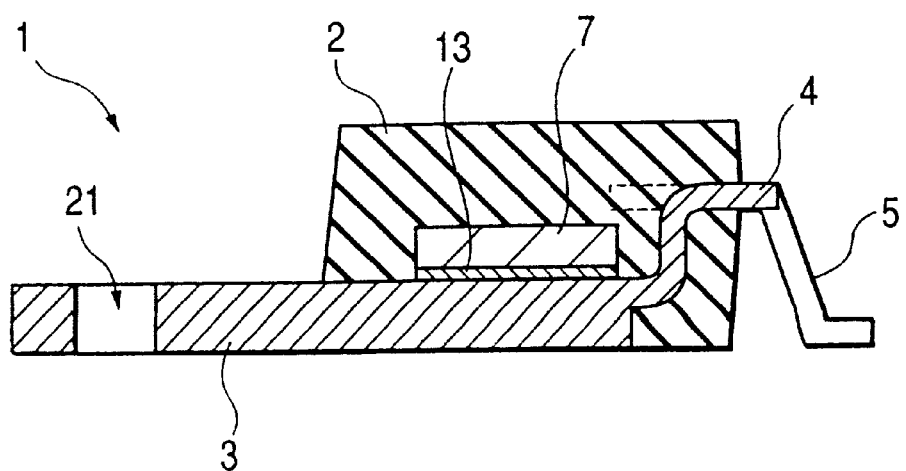
FIG. 2 is a sectional view of the semiconductor device of the first embodiment.

As shown in FIGS. 1 and 2, a semiconductor device 1 of the first embodiment includes an encapsulation element 2 made of insulating resin, a support substrate 3 made of metal covered at least in a part thereof by the encapsulation element 2 and uncovered by the encapsulation element 2 at a lower surface thereof which is to serve as a first electrode, a suspended lead 4 contiguous with the support substrate 3 protruding from one side surface of the encapsulation element 2 and bent in the middle to form a step, and second electrode lead 5 and a control electrode lead 6 protruding in parallel from the side surface of the encapsulation element 2.

A semiconductor chip 7 is provided in the encapsulation element (package) 2. A power MOSFET is formed on the semiconductor chip 7 and, as shown in FIGS. 3 and 4, it has a structure in which it includes a first electrode (drain electrode) 10 on a lower surface thereof and a second electrode (source electrode) 11 and a control electrode (gate electrode) 12 on an upper surface thereof.

The drain electrode 10 on the lower surface of the semiconductor chip 7 is secured to the support substrate (header) 3 through a conductive bonding material 13. The ends of the second electrode lead (source lead) 5 and control electrode lead (gate lead) 6 extending into the encapsulation element 2 are connected through wires 14 to the source electrode 11 and gate electrode 12 of the semiconductor chip 7, respectively.

The suspended lead 4 is cut in the vicinity of the encapsulation element 2 into a form which is not used for mounting. Further, the source lead 5 and gate lead 6 are molded in the form of a gull wing to provide a structure for surface mounting. That is, the lower surfaces of mounting regions of the gull-wing-shaped leads at the ends thereof are positioned on the same plane as that of the lower surface of the header 3.

While one each suspended lead 4 and gate lead 6 is provided, two source leads (second electrode leads) 5 are provided. The two source leads 5 extend in parallel and are coupled to the same side of a single coupling portion 20 in the encapsulation element 2. The coupling portion 20 and the second electrode (source electrode) 11 of the semiconductor chip 7 are connected by four wires 14. The coupling portion 20 is longer than a conventional part to which two wires are connected in parallel so that the four wires 14 can be connected in parallel.

In other words, the coupling portion 20 constitutes a wire connecting portion as described above from which a plurality of leads, e.g., two leads, extend. The leads extending from the wire connecting portion constitute the source lead (second electrode lead) 5.

The four wires 14 are aluminum wires having a diameter of 500 μm and a connecting length (wire length) of 6.0 mm or less.

The wire 14 connected to the gate lead 6 is an aluminum wire having a diameter of about 100 μm.

A mounting hole 21 to be used for mounting on a printed circuit board is provided in the middle of the header 3 outside the encapsulation element 2.

Examples of the dimensions of each part will now be described. The header 3 has a width of 10.4 mm in its widest region, a length of 12.66 mm and a thickness of 1.26 mm. The three leads, i.e., the source leads 5 and gate lead 6, are at a pitch of 3.4 mm, and the suspended lead 4 is positioned between one gate lead 6 and source lead 5 adjacent to each other. Each of the leads has a width of 0.9 mm and a thickness of 0.6 mm, and leads that constitute different electrodes are spaced at an interval of 0.45 mm or more to prevent shorting.

The coupling portion 20 has a length of 5.4 mm and a width of 1.35 mm. The distance between the lower surface of the header 3 and the lower surface of each lead is 2.59 mm. The encapsulation element 2 has a width which is the same as the maximum width of the header 3 and a thickness of about 5.5 mm.

As shown in FIGS. 3 and 4, the semiconductor chip 7 has a structure in the form of a thin rectangular plate and, for example, has a length of 5.0 mm, a width of 4.3 mm and a thickness of about 270 μm. The size of the gate electrode 12 is 0.3 mm along one side of the rectangular configuration thereof and is 0.6 mm along the other side. The size of the source electrode 11 is 1.4 mm along one side of the rectangular configuration thereof and is 4.2 mm along the other side.

As shown in FIG. 4, the power MOSFET formed on the semiconductor chip 7 is a vertical MOSFET having a structure in which a multiplicity of MOSFET cells are formed on an epitaxial layer 26 of a first conductivity type on the surface of a semiconductor substrate 25 made of silicon of the first conductivity type and in which the first electrode (drain electrode) 10 is provided on the lower surface of the semiconductor substrate 25. For example, the drain electrode 10 is formed from titanium, nickel or gold and has a thickness of 5.0 μm.

The power MOSFET is formed by a plurality of wells 27 of a second conductivity type formed in alignment with each other in the surface area of the epitaxial layer 26, source regions 28 of the first conductivity type formed in the surface area of the wells 27, gate insulation films 29 provided between adjoining wells 27, gate electrodes 30 formed on the gate insulation films 29, layer insulation films 31 covering the gate electrodes 30, source electrodes 11 selectively provided on the epitaxial layer 26 and layer insulation films 31 in electrical connection to the source regions 28, a protective film 32 selectively covering the source electrodes 11, layer insulation films 31 and the like and partially exposing the source electrodes 11 and gate electrodes 12 as wire boding regions and the like.

This power MOSFET has characteristics indicated by "D6 (device 6 series)" in FIGS. 5 and 6.

FIG. 5 is a graph showing source-drain on resistance and drain current characteristics, and FIG. 6 is a graph showing the relationship between saturation of the drain current and source-drain voltage by on resistance.

As apparent from the graph in FIG. 5, on resistance $R_{on}$ of the device 4 series (D4) is 20 mΩ when $V_{GS}$ of 10 V and $I_D$ of 100 A are applied; on resistance $R_{on}$ of the device 5 series (D5) is 7.0 mΩ when $V_{GS}$ of 10 V and $I_D$ of 100 A are applied; and on resistance $R_{on}$ of the device 6 series (D6) is 4.0 mΩ when $V_{GS}$ of 10 V and $I_D$ of 100 A are applied.

Therefore, when $I_D$ is 100 A, D4 has a saturation voltage $V_{DS}$ of 2000 mV because its on resistance is 20 mΩ; D5 has a saturation voltage $V_{DS}$ of 700 mV because its on resistance is 7.0 mΩ; and D6 has a saturation voltage $V_{DS}$ of 400 mV because its on resistance is 4.0 mΩ.

As a result of improvements on electrical characteristics, for each new generation of devices, the driving voltage is decreased; transmission speed (switching speed) is increased; and the case temperature (the generation of heat from the package) is decreased through reduction of current ($I_D$) loss.

However, even the D6 series of components are subjected to significant generation of heat at the package when $I_D$ is 100 A. Under such circumstances, the first embodiment employs a structure in which two second electrode leads (source leads) 5 are used to improve thermal conduction through the source leads 5 and in which the number of wires to connect the source electrode and source leads 5 is increased from two in the prior art to four in order to suppress the generation of heat in the region of the wires.

A description will now be made on power lost in the region of the wires when the drain current ($I_D$) is applied. The lost power P is given by the following equation.

$$P = I^2 \cdot R_{wire} \qquad \text{Equation 1}$$

where I represents the current; $R_{wire}$ represents the resistance of the wires. $R_{wire}$ is given by the following equation.

$$R_{wire} = \rho \cdot l / A \qquad \text{Equation 2}$$

where l represents the length of the wires; A represents the diameter of the wires; and ρ represents specific resistance of the wires. The wire resistance $R_{wire}$ of two wires according to the prior art is given as follows from Equation 2.

$$R_{wire} = 3.1 \times 10^{-8} \cdot 6.0 \times 10^{-3} / (250 \times 10^{-6} \times 250 \times 10^{-6} \times 3.14) \times 2 = 0.47 \times 10^{-3} \qquad \text{Equation 3}$$

The wire resistance of four wires according to the first embodiment is as follows.

$$R_{wire} = 3.1 \times 10^{-8} \cdot 6.0 \times 10^{-3} / (250 \times 10^{-6} \times 250 \times 10^{-6} \times 3.14) \times 4 = 0.24 \times 10^{-3} \qquad \text{Equation 4}$$

Therefore, the power lost at a conventional power MOSFET utilizing two wires having a diameter of 500 μm and a power MOSFET according to the first embodiment utilizing four wires under the application of a voltage is calculated as follows using Equations 1, 2, 3 and 4.

In the case of two wires according to the prior art, $$P = (100)^2 \cdot 0.47 \times 10^{-3} = 4.7 \, [W] \qquad \text{Equation 5}$$

In the case of four wires according to the invention, $$P = (100)^2 \cdot 0.24 \times 10^{-3} = 2.3 \, [W] \qquad \text{Equation 6}$$

Such a reduction in power loss during the application of a voltage suppresses the deterioration of resin that constitutes an encapsulation element attributable to the generation of heat at the region of wires and allows a power MOSFET to operate with stability.

A description will now be made with reference to FIGS. 7 through 14 on a method for manufacturing the semiconductor device according to the first embodiment. FIGS. 9 through 14 are schematic views.

Figure 7:
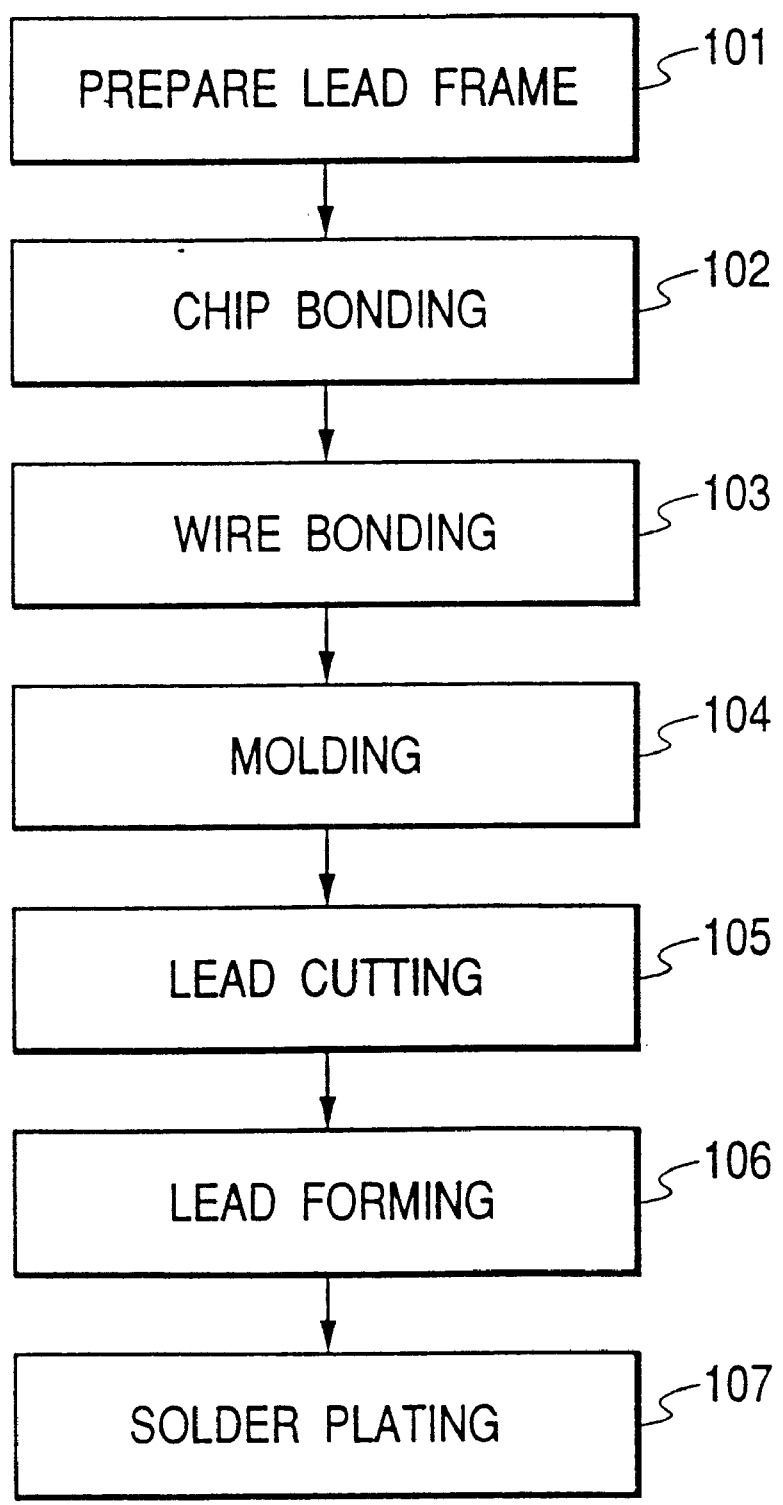
FIG. 7 is a flow chart showing a method for manufacturing the semiconductor device of the first embodiment.

As shown in the flow chart in FIG. 7, the semiconductor device 1 is manufactured through the steps of providing a lead frame (step 101), chip bonding (step 102), wire bonding (step 103), molding (step 104), lead cutting (step 105), lead shaping (step 106) and solder plating (step 107).

Figure 8:
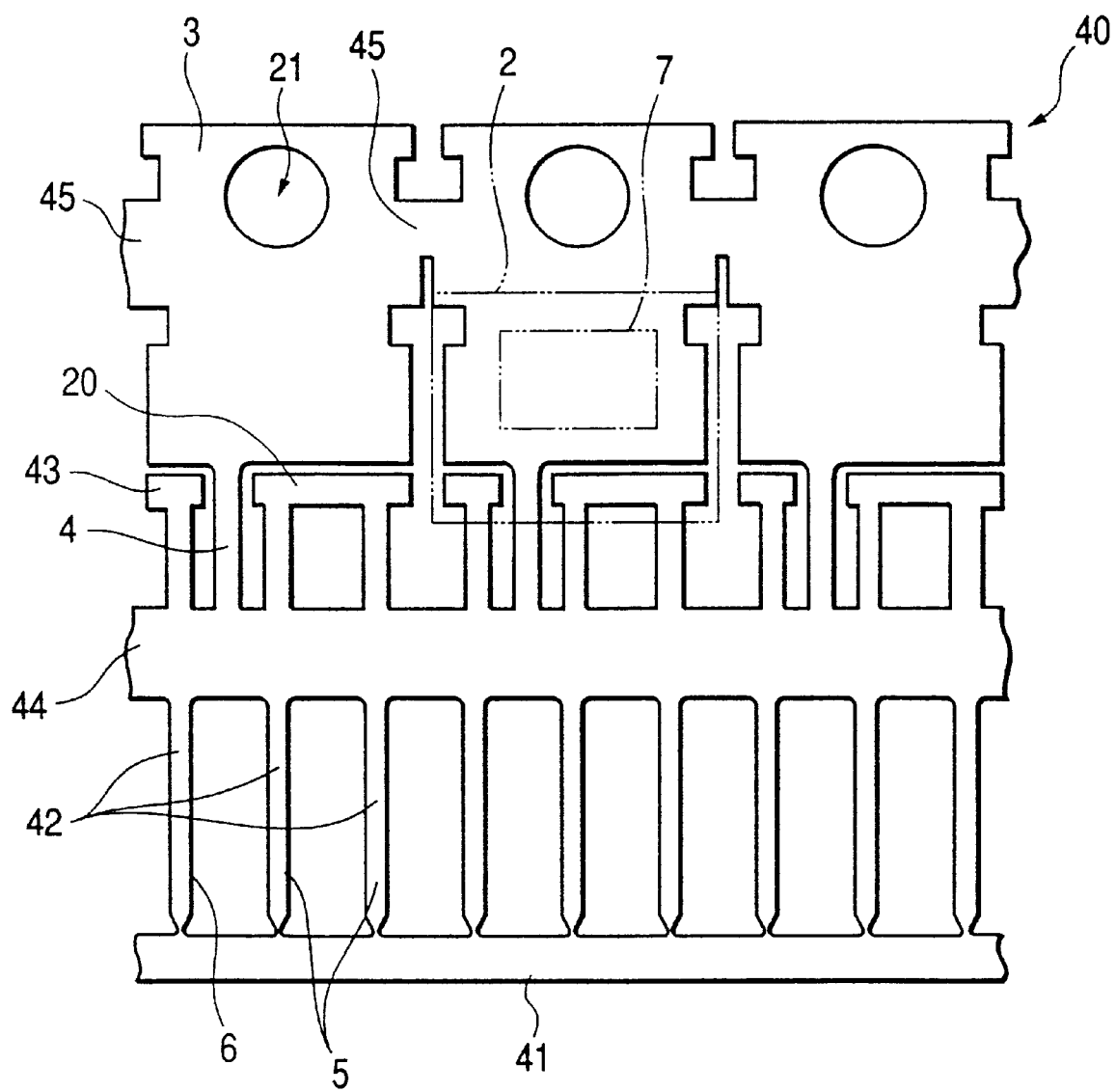
FIG. 8 is a plan view of a lead frame used for the manufacture of the semiconductor device of the first embodiment.
Figure 9:
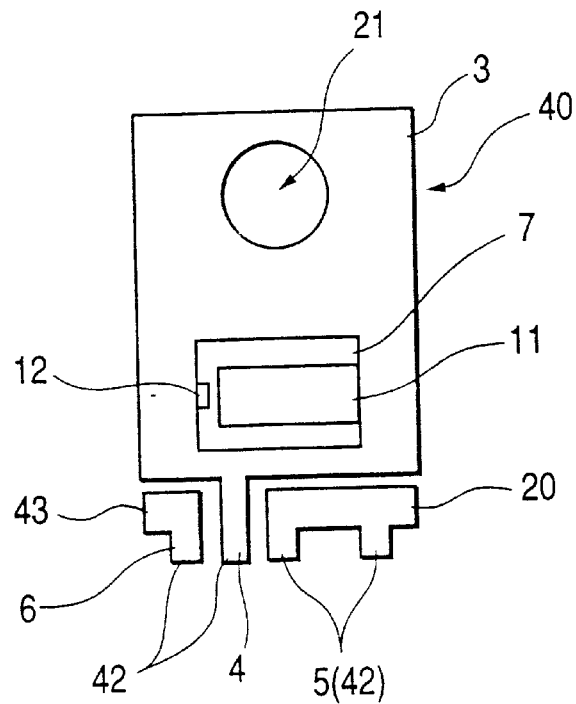
FIG. 9 is a schematic plan view of a part of the lead frame in a state in which a chip is secured to a header during the manufacture of the semiconductor device of the first embodiment.

Specifically, as shown in FIGS. 8 and 9, the manufacture of the semiconductor device 1 is started by providing a lead frame 40 (step 101). As shown in FIG. 8, the lead frame 40 has a structure in which a metal plate made of a copper alloy or the like in the form of a band whose thickness is larger on one side thereof in a predetermined width (a material having an irregular shape) is punched by a precision press to be patterned and in which the thinner part is bent to be raised from the thicker part (a step of 1.26 mm). The thicker part constitutes a header 3 as described above having a thickness of 1.26 mm, and the thinner part is the region of a suspended lead 4, source leads 5 and a gate lead 6 having a thickness of 0.6 mm.

The lead frame 40 is a rectangular element, and a predetermined number of (e.g., 10) semiconductor devices 1 can be manufactured from one lead frame 40. FIG. 8 shows three devices.

As shown in FIG. 8, the lead frame 40 includes a thin outer frame 41 and a plurality of leads 42 in a cantilever structure protruding in parallel at constant intervals from one side of the outer frame 41. The leads 42 are orthogonal to the outer frame 41. The pitch of the leads 42 is 3.4 mm.

Three each of the leads 42 form one group, and the left side lead of the group constitutes the gate lead 6 which has a wide wire pad 43 on the end thereof. The width of each lead 42 is 0.9 mm, and the wire pad 43 has a width of 2.0 mm and a length of 1.36 mm.

The two leads 42 to the right constitute the source leads 5. The two source leads 5 are contiguous with one side of one coupling portion 20 as described above. The coupling portion 20 extends in parallel with the outer frame 41 and has a length of 5.4 mm in the extending direction and a length in the direction orthogonal thereto, i.e., a width, of 1.36 mm.

The leads 42 are combined by a tie bar 44 extending in parallel with the outer frame 41.

The suspended lead 4 protrudes from the tie bar 44 between the gate lead 6 and the source lead 5 adjacent thereto. The suspended lead 4 is bent downward in the middle thereof to form one step and is coupled to the header 3 having the above-described configuration at the end thereof. The step formed by bending has a size of 2.59 mm. Adjoining headers 3 are connected to each other by a narrow link portion 45. The mounting hole 21 is provided on the header 3 as described above.

The link portions 45, outer frames 41 and tie bars 44 allow unit lead frames to be formed into a multiple lead frame configuration. After the molding in the manufacture, the link portions 45, outer frames 41 and tie bars 44 are cut and removed.

A semiconductor chip 7 as shown in FIGS. 3 and 4 is secured on the header 3 of the lead frame 40 as indicated by the two-dot chain line in FIGS. 9 and 8 (step 102). The semiconductor chip 7 is secured to the header 3 by a bonding material 13 constituted by solder or the like at the region of a drain electrode 10 on the lower surface thereof (see FIGS. 1 and 4).

Figure 10:
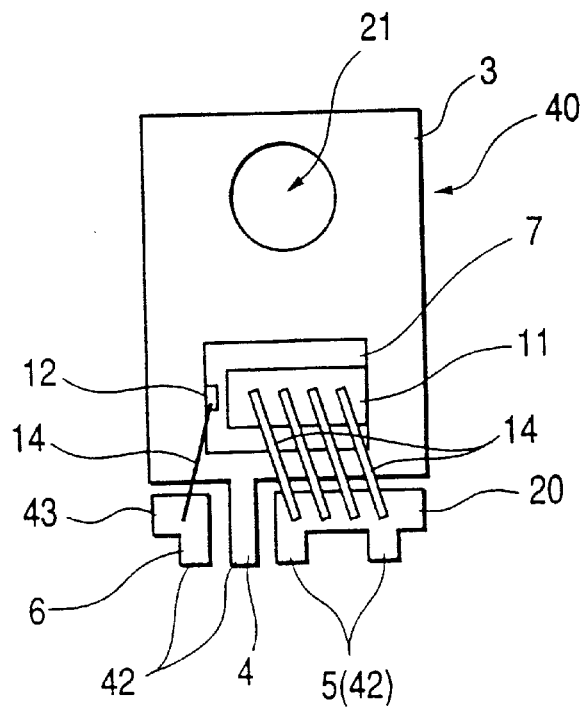
FIG. 10 is a schematic plan view of a part of the lead frame after wire bonding during the manufacture of the semiconductor device of the first embodiment.

Next, as shown in FIG. 10, the electrodes on the upper surface of the semiconductor chip 7 are connected to leads associated therewith with wires 14 (step 103). Specifically, the gate electrode 12 and the wire pad 43 of the gate lead 6 are connected by a wire 14 (ultrasonic wire bonding). This wire 14 may be thin because it carries a small amount of current when a voltage is applied and, for example, it is an aluminum wire having a diameter of about 100 μm. The source electrode 11 of the semiconductor chip 7 and the coupling portion 20 are connected with wires 14 by means of ultrasonic wire bonding. This wire bonding bonds four aluminum wires having a diameter of 500 μm in parallel on the basis of parallel bonding or stitch bonding. The wire length for the bonding is in the range from 5.23 to 5.62 mm, which satisfies the above-described wire length of 6.0 mm or less.

Since the wire bonding area of the source electrode 11 of the semiconductor chip 7 is a rectangular area of 1.4 mm×4.2 mm as described above, the four wires 14 can be connected as they are without changing the size of the area.

Figure 11:
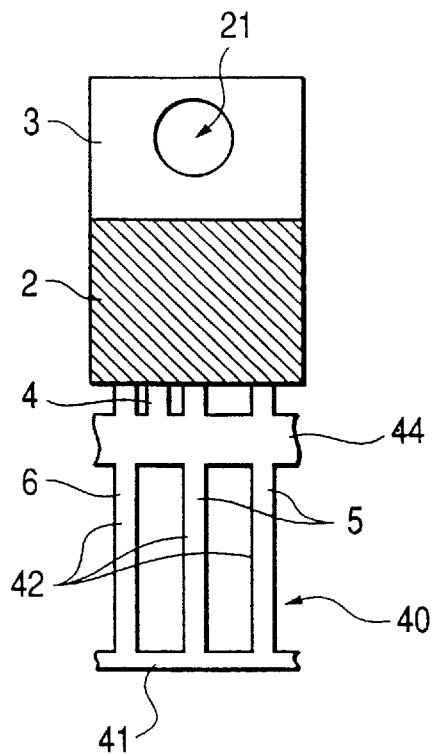
FIG. 11 is a schematic plan view of a part of the lead frame after molding during the manufacture of the semiconductor device of the first embodiment.

Then, as shown in FIG. 11, molding is performed on the basis of transfer molding or the like (step 104) to cover the ends of the leads 42 in a cantilever structure and the header 3 up to the middle thereof with an encapsulation element 2 made of insulating resin. Since the encapsulation element 2 covers only the upper surface of the header 3, the lower surface of the header 3 is exposed from the encapsulation element 2 to serve as a heat transfer surface for radiation of heat.

Figure 12:
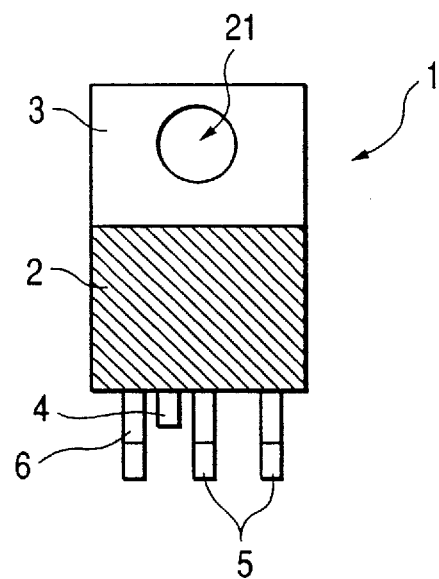
FIG. 12 is a schematic plan view of the semiconductor device of the first embodiment after lead cutting and lead shaping during the manufacture of the same.

Next, as shown in FIG. 12, normal lead cutting and shaping apparatuses are used to cut and shape the leads (steps 105 and 106). During the lead cutting, the leads 42 are cut off from the outer frames 41; the suspended leads 4 are cut in the vicinity of the encapsulation elements 2; the tie bar 44 is cut and removed in a predetermined width; and the link portions 45 between the headers 3 are punched into slits to separate the headers 3. During the lead shaping, the gate leads 6 and source leads 5 are cut to define the dimensions of the same and are shaped into a gull wing configuration.

Figure 13:
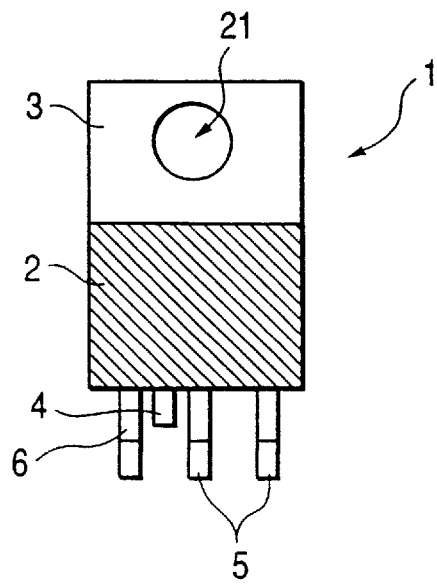
FIG. 13 is a schematic plan view of the semiconductor device of the first embodiment in a completed state in which solder has been plated on the leads during the manufacture of the same.

Next, as shown in FIG. 13, a solder plating process is conducted on the surface of the leads protruding from the encapsulation element 2 (step 107). The shaded regions in FIG. 13 are plated regions of the leads. This completes the manufacture of a semiconductor device 1 having a structure for surface mounting.

Figure 14:
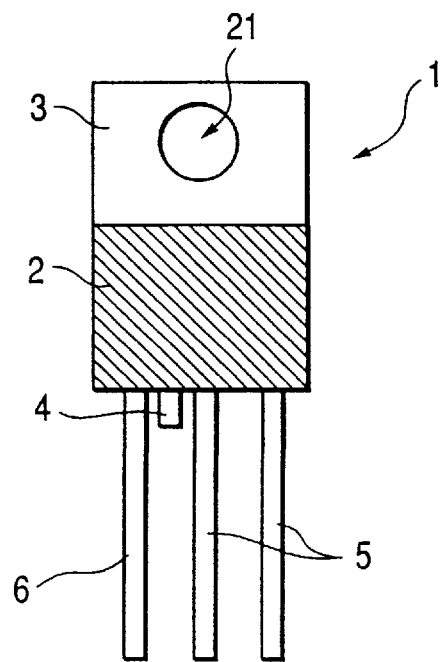
FIG. 14 is a plan view of an insertion mount type semiconductor device which is a modification of the semiconductor device of the first embodiment.
Figure 15:
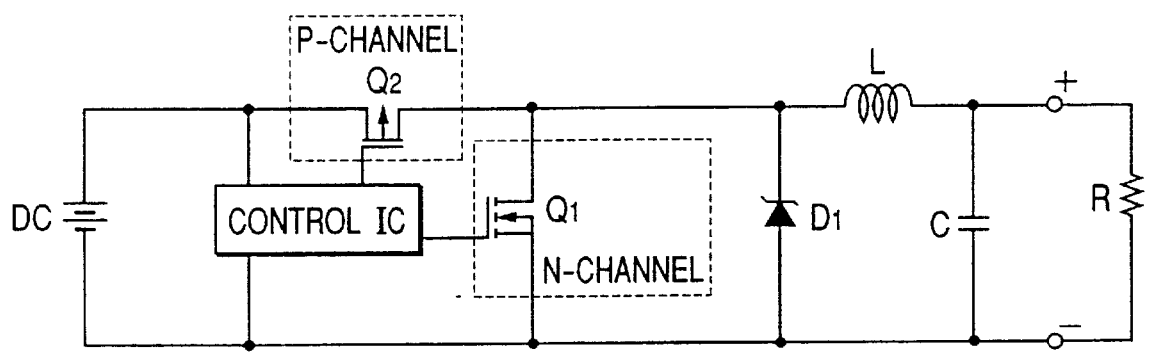
FIG. 15 is a power supply circuit diagram of an electronic apparatus incorporating the semiconductor device of the first embodiment.

While the leads have a structure for surface mounting in the first embodiment, a semiconductor device 1 having a structure for insertion mounting as shown in FIG. 14 can be manufactured by defining the lead dimensions at the lead cutting step appropriately without shaping the leads as described above and by performing a solder plating process thereafter.

FIG. 15 shows a rectifier circuit incorporating semiconductor devices 1 according to the first embodiment. This rectifier circuit comprises a main circuit and a phase correction (SR) circuit, an output (Vout) is provided from the main circuit to a connection circuit (R) or from the phase correction circuit to the connection circuit (R) when AC-to-DC conversion is carried out.

Two power MOSFETs Q1 and Q2 to which signals (+, -) from a power supply (DC) are input are controlled by a control IC. For example, the control IC is constituted by a switched regulator or the like.

The power MOSFETs Q1 and Q2 are a main switch transistor Q2 incorporating a p-channel MOSFET and a phase correction (SR) transistor Q1 incorporating an n-channel MOSFET, respectively. The outputs of those transistors are smoothed by a Zenner diode D1. A low-pass filter is formed by a coil L and a capacitor C.

The main switch transistor Q2 operates on the positive input (the phase correction transistor Q1 is turned off) to form the main circuit to provide the output (Vout) to the connection circuit(R), whereas the phase correction transistor Q1 operates on the negative input (the main switch transistor Q2 is turned off) to form the phase correction circuit to provide the output (Vout) to the connection circuit (R).

Therefore, a semiconductor device 1 having the configuration of the first embodiment which incorporates an n-channel MOSFET as the semiconductor chip 7 can be used as the phase correction transistor Q1, and a semiconductor device 1 incorporating a p-channel MOSFET as the semiconductor chip 7 can be used as the main switch transistor Q2.

A semiconductor device 1 according to the first embodiment (low voltage drive power transistor) is incorporated in, for example, chargers for portable telephones and video cameras, OA apparatuses and power supplies of notebook type personal computers for purposes such as power management during charging and discharging of a lithium ion secondary battery.

The first embodiment has the following effects.

(1) Since two second electrode leads (source leads) 5 are provided, the amount of heat transferred to the printed circuit board is increased in accordance with an increase of a heat transferring sectional area, which improves the heat transfer effect to allow the power MOSFET to operate with stability.

(2) The two source leads 5 are combined at the elongate coupling portion 20 in the encapsulation element 2, and four thick aluminum wires 14 (having a diameter of 500 μm) are connected to the coupling portion 20. As a result, even when the drain current is significantly increased from those in the prior art, output loss can be suppressed to allow the amount of generated heat to be suppressed. This makes it possible to suppress deterioration of the resin that constitutes the encapsulation element 2 and to thereby expand the life of the power MOSFET.

(3) Since heat generated at the wires 14 and the semiconductor chip 7 is transferred to the printed circuit board through the four thick wires 14 and the two source leads 5 that improve the heat transfer effect, effective radiation of heat can be achieved.

(4) The control electrode lead (gate lead) 6 and the second electrode lead 5 may be extended straightly to provide a structure for insertion mounting.

(5) The suspended lead 4 may be formed into a structure for surface mounting or insertion mounting instead of cutting it in the vicinity of the encapsulation element 2 to use it as a lead for the first electrode (drain electrode).

The two source leads 5 may have a structure in which they are integrated with each other outside the encapsulation element 2 through a linking piece. In this structure, since the leads have a wide structure, the heat transfer effect is improved to improve the radiation effect at the source electrode.

Further, inserting portions for insertion mounting are provided at the ends of the leads out of the region of the linking piece in this structure. Therefore, insertion mounting can be carried out using the inserting portions to allow both of surface mounting and insertion mounting.

When insertion mounting is used, since the two source leads are linked by the linking piece, they are always kept at a constant interval to facilitate the insertion mounting.

A second embodiment of the invention will now be described.

Figure 16:
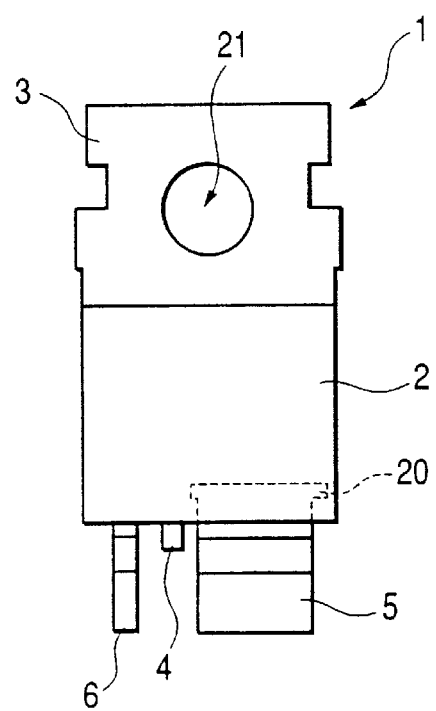
FIG. 16 is a plan view of a semiconductor device which is another embodiment of the invention (second embodiment).

FIG. 16 is a plan view of a semiconductor device which is another embodiment (second embodiment) of the invention. The second embodiment is an example having a configuration one second electrode lead (source lead) 5 is provided which has a width wider than that of the control electrode lead (gate lead) 6. The source lead 5 may have a maximum width substantially the same as the length of the coupling portion 20. In this example, it is slightly narrower than the length of the coupling portion 20. Both of the source lead 5 and gate lead 6 are shaped into a gull-wing configuration to provide a structure for surface mounting.

In addition to the same effects as those of the first embodiment, a semiconductor device 1 according to the second embodiment has an improved heat transfer effect to contribute to a stable operation of a power MOSFET because of its configuration in which one source lead 5 is provided to increase a heat transferring sectional area.

A third embodiment of the invention will now be described.

Figure 17:
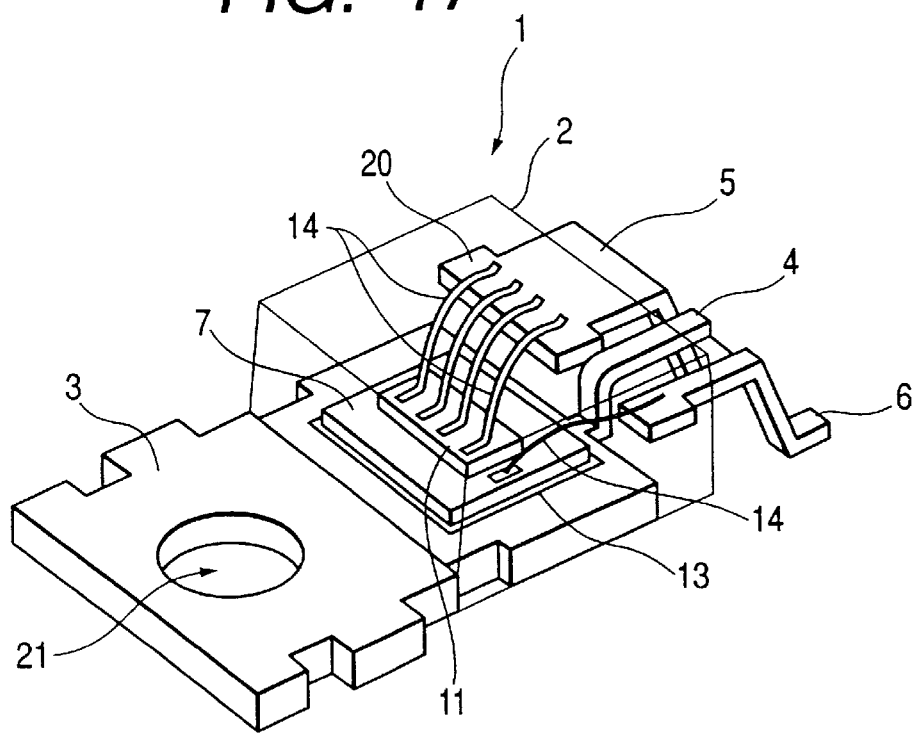
FIG. 17 is a schematic perspective view of a semiconductor device which is another embodiment of the invention (third embodiment).
Figure 18:
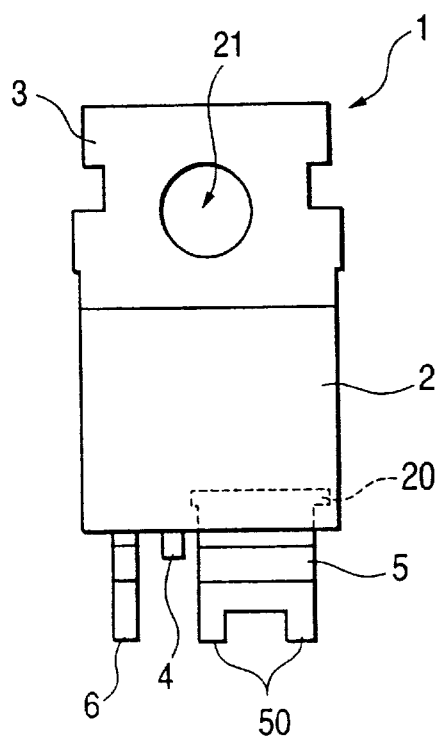
FIG. 18 is a plan view of the semiconductor device of the third embodiment.
Figure 19:
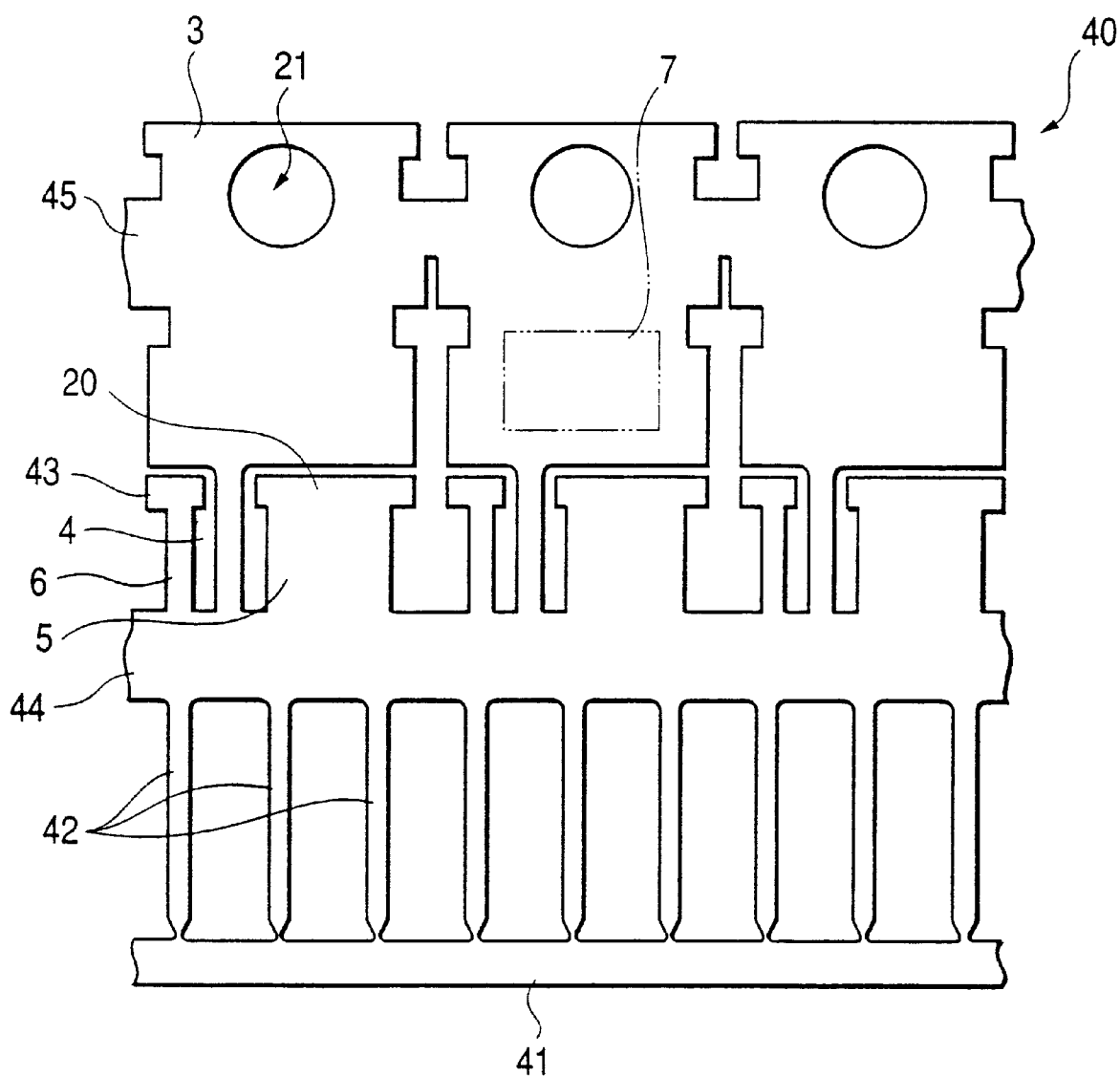
FIG. 19 is a plan view of a lead frame used for the manufacture of the semiconductor device of the third embodiment.

FIGS. 17 through 19 are views related to a semiconductor device which is another embodiment (third embodiment) of the invention. FIG. 17 is a schematic sectional view of the semiconductor device. FIG. 18 is a plan view of the same. FIG. 19 is a plan view of a lead frame used for the manufacture of the semiconductor device.

The third embodiment is a single lead having a configuration in which a source lead 5 is wider than a gate lead 6 as in the second embodiment, but the end of the source lead 5 in this example has a structure that allows insertion mounting.

Specifically, inserting portions 50 for insertion mounting are formed as protrusions from the end of the wide structure of the source lead 5. The two inserting portions 50 have the same pitch as that of the gate lead 6 to provide a structure for insertion mounting and, for example, the pitch is 3.4 mm.

A lead frame 40 as shown in FIG. 19 is used to manufacture a semiconductor device 1 of the third embodiment. The lead frame 40 has a structure formed by combining source leads 5 of a lead frame 40 as shown in FIG. 8 used to manufacture a semiconductor device 1 according to the first embodiment into one lead at side of a tie bar 44 toward a header 3. While the ends of the source leads 5 to which four wires 14 are connected no longer form a coupling portion 20 because the source leads 5 are combined into one lead, such a region will be referred to as "coupling portion 20".

The manufacture of the semiconductor device 1 according to the third embodiment the same as that in the first embodiment and will not therefore be described here.

The source lead 5 of the semiconductor device 1 according to the third embodiment also has a single wide lead structure similar to that in the second embodiment to provide an increased heat transferring surface area, thereby improving the heat transfer effect further.

In the semiconductor device 1 according to the third embodiment, the inserting portions 50 are provided at the end of the source lead 5 having a wide structure to form a structure for insertion mounting in combination with the gate lead 6. Therefore, the semiconductor device 1 can be mounted on a printed circuit board on a surface mounting basis and also on an insertion mounting basis, and it is thus a general purpose type which accommodate both of surface mounting and insertion mounting.

A fourth embodiment of the invention will now be described.

Figure 20:
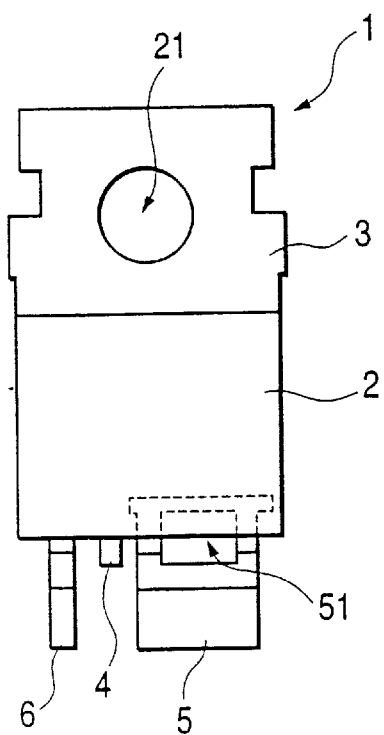
FIG. 20 is a plan view of a semiconductor device which is another embodiment of the invention (fourth embodiment).

FIG. 20 is a plan view of a semiconductor device which is another embodiment (fourth embodiment) of the invention. The fourth embodiment employs a structure suitable for a case wherein a source lead 5 has a wide structure, a case wherein a source lead 5 is bent in the vicinity of an encapsulation element 2 to provide a structure for surface mounting, a case wherein a source lead 5 is several times wider than a gate lead 6, requires a great force to bend and can therefore cause damages such as cracks on the resin that constitutes the encapsulation element 2.

Specifically, one or a plurality of holes 51 for uniform bending are provided in a bent portion of the source lead 5 in order to uniformly bend and shape each part of the source lead 5 having a wide structure. This makes it possible to keep each width in the bent portion of the source lead 5 at a value equal to or smaller than the width of the gate lead 6.

While the fourth embodiment has one hole 51 for uniform bending, a structure may be adopted in which a plurality of holes for uniform bending having smaller widths are provided. In this case, branch pieces connected to a coupling portion 20 are provided between those holes 51 for uniform bending, and this allows heat transfer through those regions to improve the heat transfer effect.

Further, since the width of the bent portion of the source lead 5 is the same as or smaller than the width of the gate lead 6 in the fourth embodiment, no great force is applied to the bent portion during lead shaping and, as a result, cracks and the like will not occur on the resin that constitutes the encapsulation element 2. This improves the shapability of the lead and consequently the yield.

An insertion portion may be provided at the end of the source lead 5 also in the structure according to the fourth embodiment to provide a structure which allows insertion mounting.

A fifth embodiment of the invention will now be described.

Figure 21:
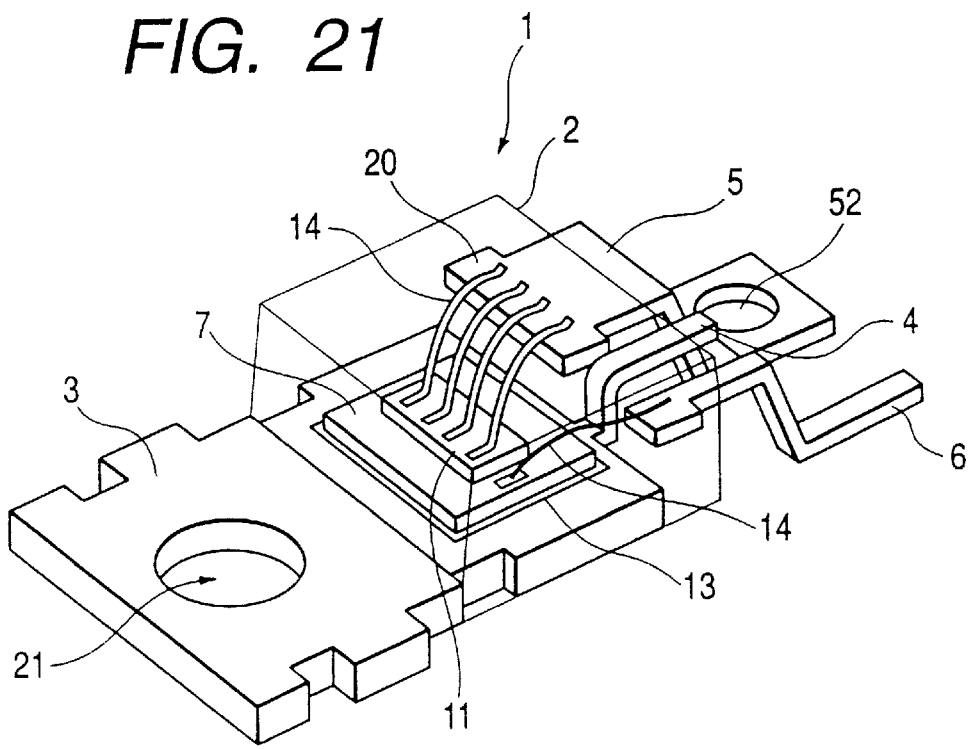
FIG. 21 is a schematic perspective view of a semiconductor device which is another embodiment of the invention (fifth embodiment).

FIG. 21 is a schematic perspective view of a semiconductor device which is another embodiment (fifth embodiment) of the invention. According to the fifth embodiment, a machine screw mounting hole 52 is provided in a mounting portion of a source lead 5 having a wide structure.

In a semiconductor device 1 according to the fifth embodiment, since the source lead 5 can be secured to the printed circuit board with a machine screw using the machine screw mounting hole 52, the lead can be secured with improved strength and can be. directly secured to the printed circuit board, which improves the heat transfer effect and contributes to a stable operation of the power MOSFET.

A protruding inserting portion for insertion mounting may obviously be formed at the end of the lead also in the semiconductor device 1 of the fifth embodiment to provide a structure that allows insertion mounting, i.e., to provide a type that accommodate both of surface mounting and insertion mounting.

A sixth embodiment of the invention will now be described.

Figure 22:
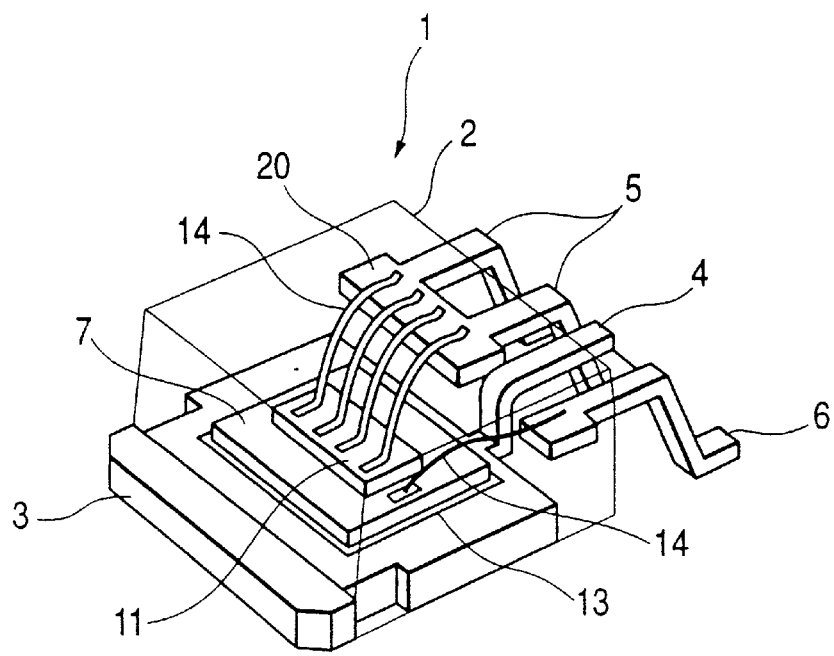
FIG. 22 is a schematic perspective view of a semiconductor device which is another embodiment of the invention (sixth embodiment).

FIG. 22 is a schematic perspective view of a semiconductor device which is another embodiment (sixth embodiment) of the invention. A semiconductor device 1 of the sixth embodiment is a compact version of the semiconductor device 1 according to the first embodiment obtained by cutting the region of the header 3 protruding from the encapsulation element 2 in the vicinity of the encapsulation element 2.

The semiconductor device 1 of the sixth embodiment has the same effects as those of the semiconductor device 1 of the first embodiment.

A seventh embodiment of the invention will now be described.

FIGS. 23 through 36 are views related to a semiconductor device which is another embodiment (seventh embodiment) of the invention.

Figure 23:
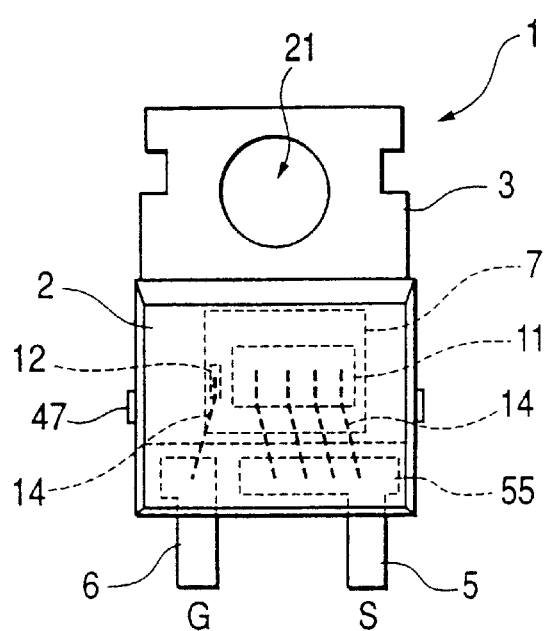
FIG. 23 is a plan view of a semiconductor device which is another embodiment of the invention (seventh embodiment).

As shown in FIG. 23, a semiconductor device 1 of the seventh embodiment has a structure in which one each second electrode lead (source (S) lead) 5 and control electrode lead (gate (G) lead) 6 protrudes from one side of an encapsulation element 2 and in which a support substrate (header) 3 is used as a first electrode (drain electrode) to provide a two-terminal configuration.

Figure 25:
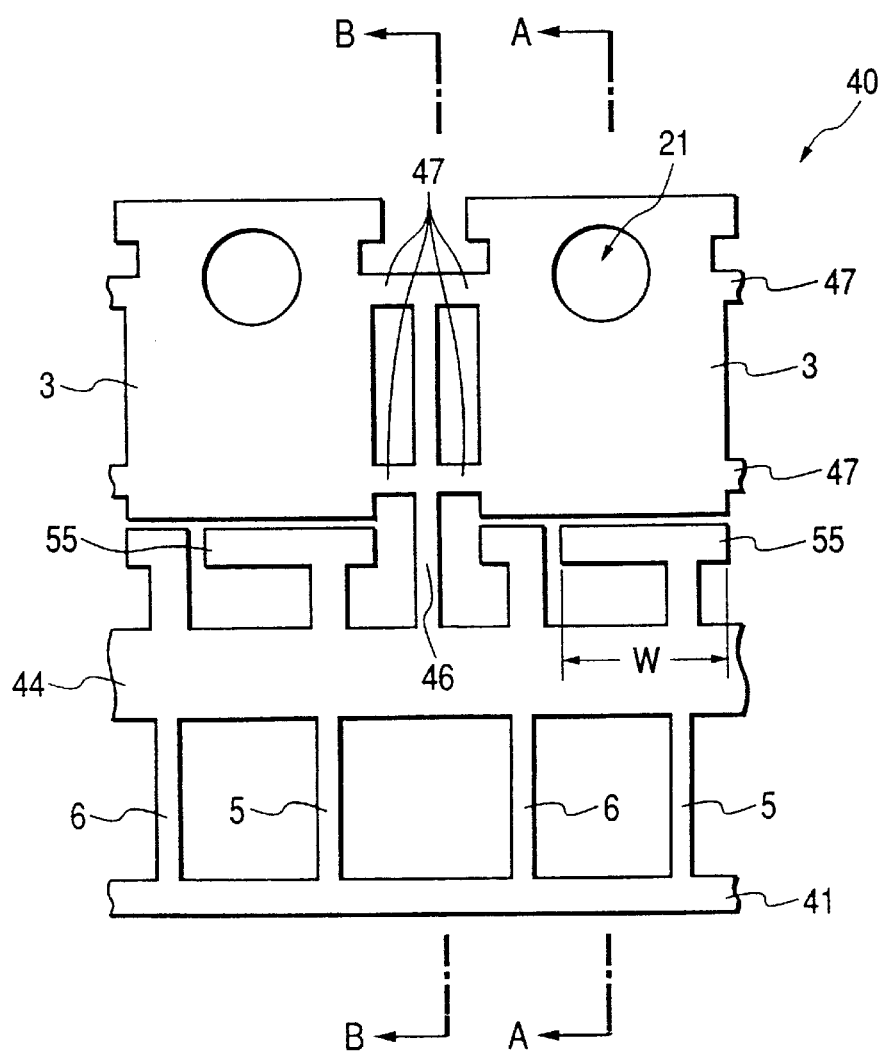
FIG. 25 is a plan view of a lead frame used for the manufacture of the semiconductor device of the seventh embodiment.
Figure 26:
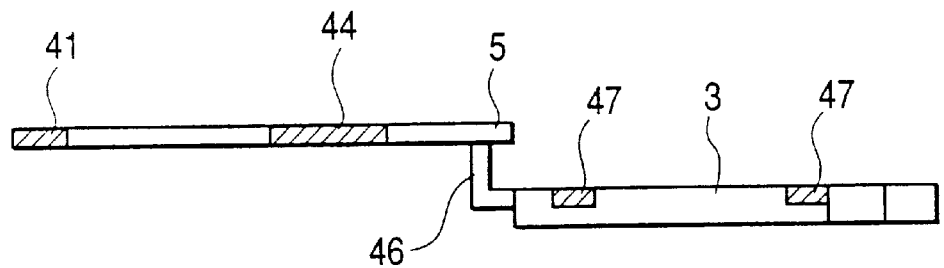
FIG. 26 is a side view of a lead frame used for the manufacture of the semiconductor device of the seventh embodiment.
Figure 27:
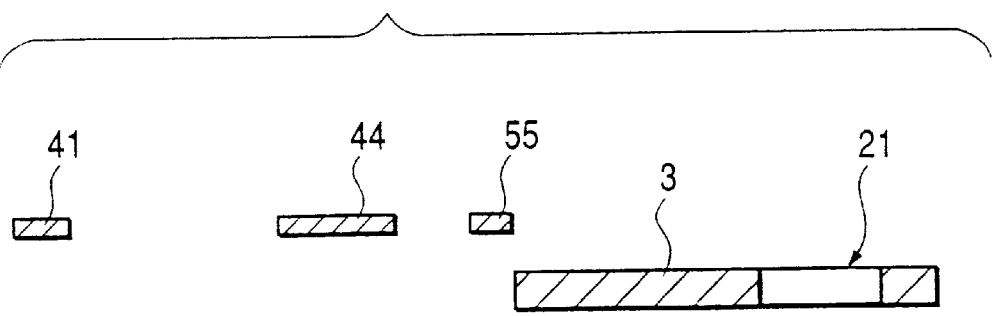
FIG. 27 is a sectional view taken along the line A—A in FIG. 25.
Figure 28:
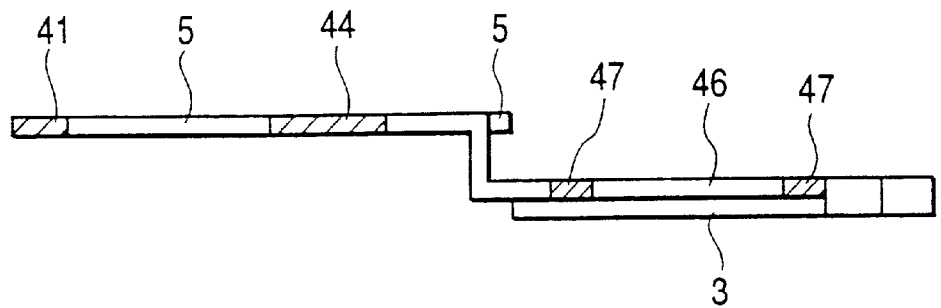
FIG. 28 is a sectional view taken along the line B—B in FIG. 25.

In the seventh embodiment of the invention, a lead frame 40 as shown in the plan view in FIG. 25 and the side view in FIG. 26 is used. This lead frame 40 has a structure in which a main support piece 46 protrudes from a tie bar 44 to extend between adjoining support substrates 3 in a lead frame 40 according to the first embodiment as shown in FIG. 8 and in which support pieces 47 protrude from both sides thereof to support the support substrate 3 at the ends thereof (see FIG. 28).

The lead frame 40 is formed by pressing a thin metal plate. Two support pieces 47 are provided on both sides of the main support piece 46. This structure for supporting the support substrate (header) 3 is referred to as "side support structure". A structure for supporting the support substrate with a suspended lead as that in the first embodiment is referred to as "suspended lead support structure".

In the seventh embodiment, one source lead 5 is provided to form a two-terminal configuration. The end (inner end) of the source lead 5 located in an encapsulation element 2 serves as a wire connecting portion 55, and the wire connecting portion 55 has a large width W and has a length that allows four thick wires 14 having a diameter as large as 500 μm to be connected thereto in parallel as in the first embodiment. For example, the width W is 6.0 mm. The interval (pitch) between the two leads is 5.08 mm. This lead structure is in compliance with JEDC specification.

Figure 29:
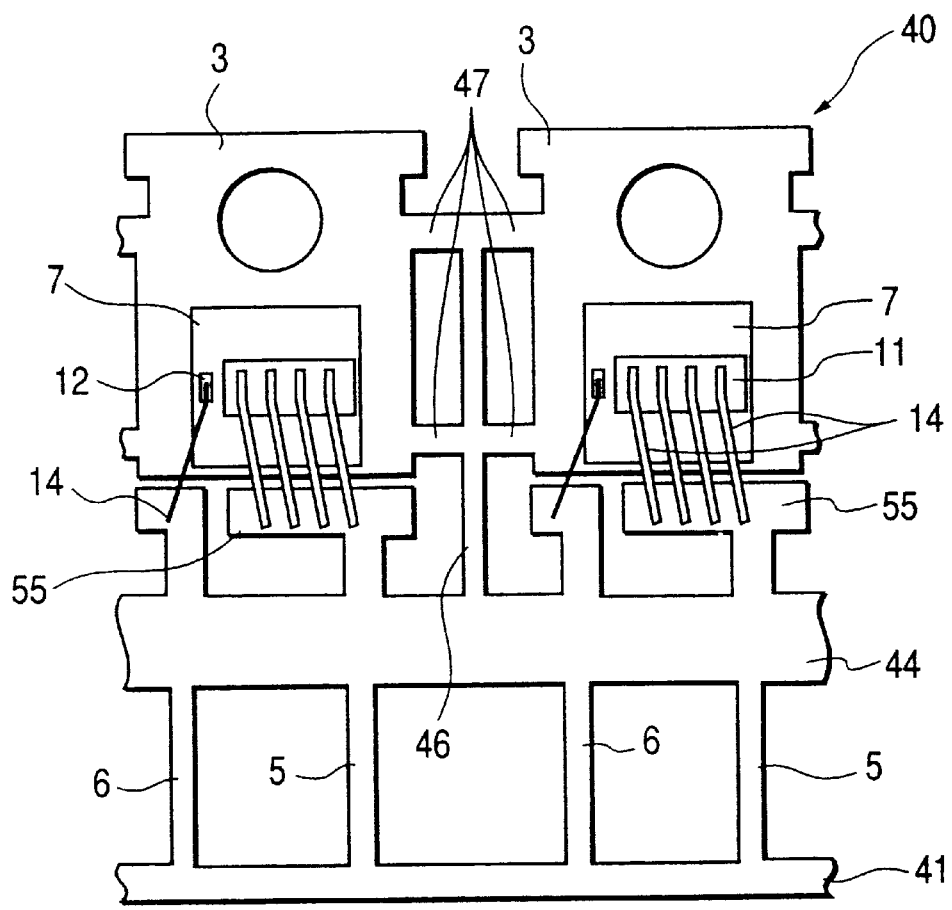
FIG. 29 is a plan view of a lead frame after wire bonding during the manufacture of the semiconductor device of the seventh embodiment.
Figure 30:
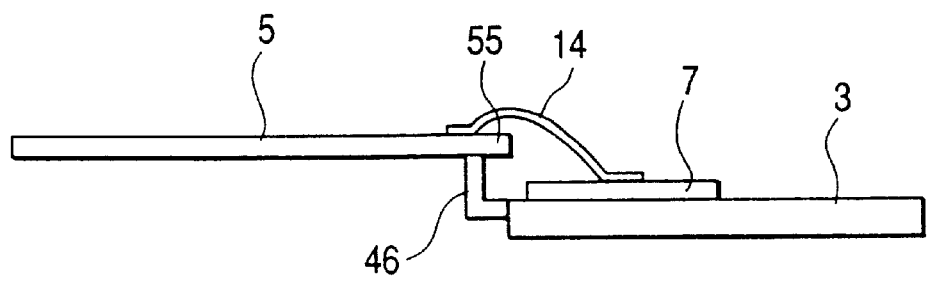
FIG. 30 is a sectional view of the lead frame after wire bonding during the manufacture of the semiconductor device of the seventh embodiment.

The semiconductor device 1 of the seventh embodiment is manufactured in the same method as that for the first embodiment. As shown in FIGS. 29 and 30, a semiconductor chip 7 having a power MOSFET formed thereon is secured to a principal surface of the support substrate 3 as in the first embodiment and, thereafter, a second electrode (source electrode) 11 of the semiconductor chip 7 and the wire connecting portion 55 of the source lead 5 are connected by four thick aluminum wires 14. A control electrode (gate electrode) 12 of the semiconductor chip 7 and the end of the gate lead 6 (wire connecting portion) are connected by a thin wire 14.

In the present embodiment and embodiments described later, "a thick wire" means a wire having a diameter of, for example, about 500 μm, and "a thin wire" means a wire having a diameter of about 100 μm.

Figure 31:
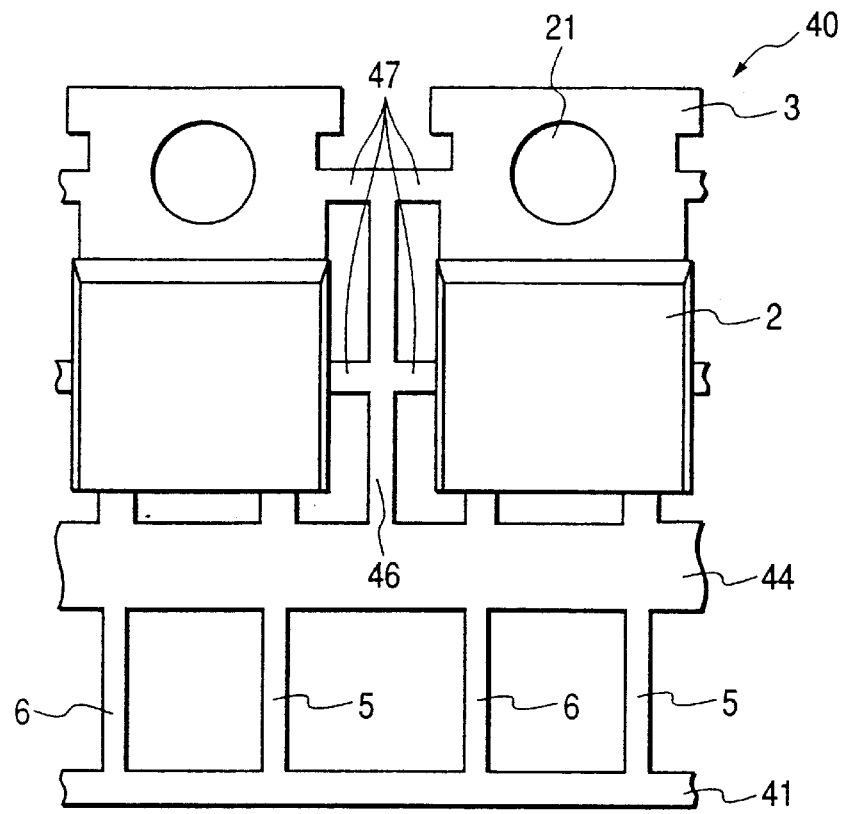
FIG. 31 is a plan view of the lead frame after molding during the manufacture of the semiconductor device of the seventh embodiment.

Next, as shown in FIG. 31, the surface region of the header 3 outside a mounting hole 21 is molded on a basis of transfer molding to encapsulate the semiconductor chip 7, wires 14 and the regions of the inner ends of the source lead 5 and gate lead 6 (wire connecting portion 55) with the encapsulation element 2.

Figure 24:
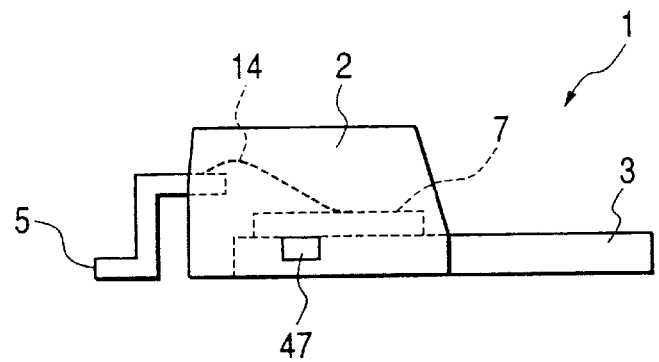
FIG. 24 is a side view of the semiconductor device of the seventh embodiment.

Then, cutting and shaping processes are carried out. Specifically, the support pieces 47 are cut in the regions of the joints to the header 3 and the tie bar 44 is cut; the source lead 5 and gate lead 6 are cut off from an outer frame 41; and the source lead 5 and gate lead 6 are shaped into a gull wing configuration to manufacture a surface mount type semiconductor device 1 as shown in FIGS. 23 and 24.

Figure 32:
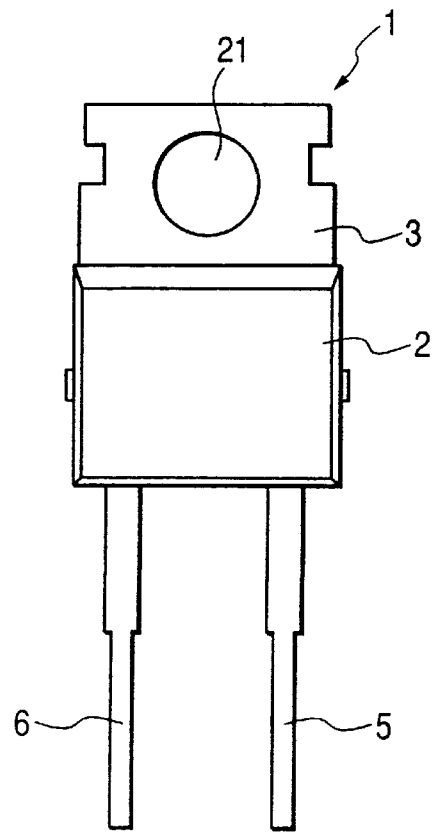
FIG. 32 is a plan view of an insertion mount type semiconductor device which is a modification of the semiconductor device of the seventh embodiment.
Figure 33:
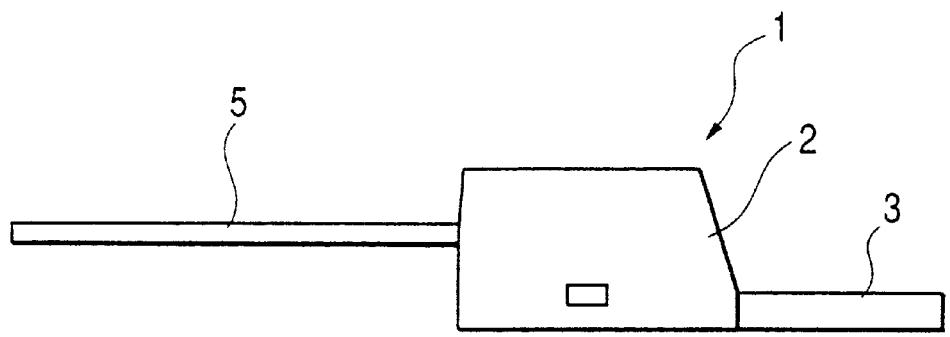
FIG. 33 is a side view of the insertion mount type semiconductor device which is a modification of the semiconductor device of the seventh embodiment.

FIGS. 32 and 33 show an insertion mounting type semiconductor device 1 formed by extending the leads thereof straightly.

Figure 34:
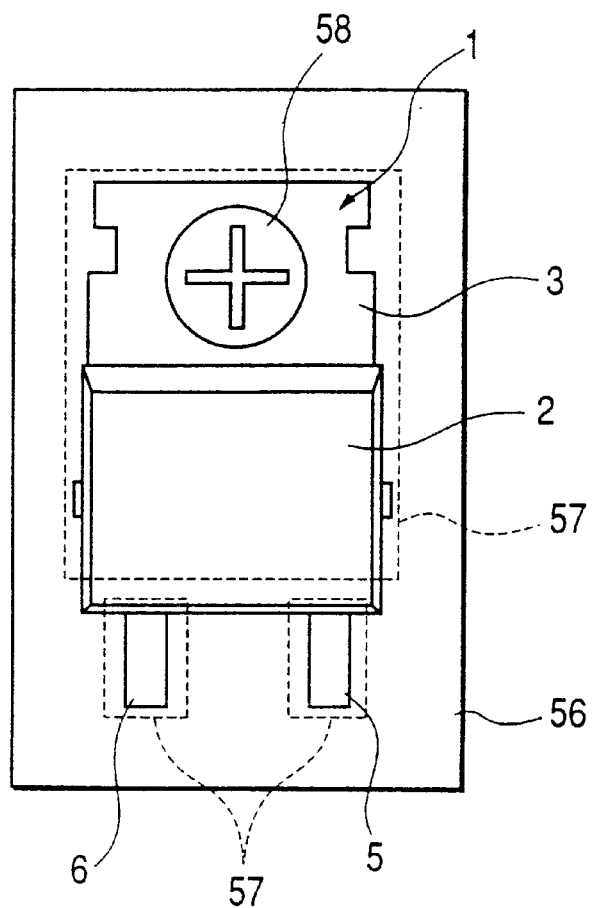
FIG. 34 is a schematic plan view of a surface mount type semiconductor device according to the seventh embodiment in a mounted state.
Figure 35:
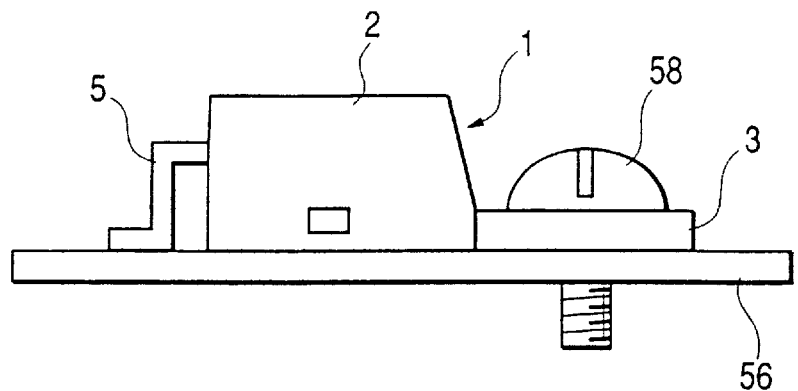
FIG. 35 is a schematic side view of the surface mount type semiconductor device according to the seventh embodiment in a mounted state.
Figure 36:
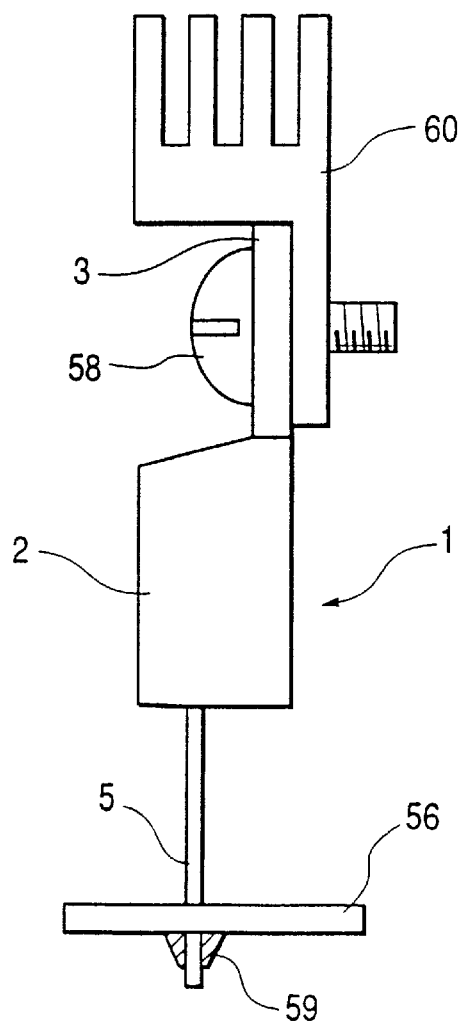
FIG. 36 is a schematic side view of the surface mount type semiconductor device according to the seventh embodiment in a mounted state.

Such a semiconductor device 1 is mounted in a manner as shown in FIGS. 34 through 36. Those figures are schematic views. FIGS. 34 and 35 respectively show a plan view and a side view in a surface-mounted state, and FIG. 36 shows a side view in an insertion-mounted state.

In the case of surface mounting, the lower surface of the header 3 and the lower surfaces of the bent ends of the source lead 5 and gate lead 6 are secured on a printed circuit board 56 using solder layers provided in advance in wiring connection portions of the same. The regions surrounded by dotted lines in FIG. 34 are connection portions 57 of the printed circuit board 56 where the header and leads are provided.

The header 3 is secured to the printed circuit board 56 with a mounting machine screw 58 which is inserted in the mounting hole. As a result, any heat generated at the semiconductor chip 7 and the wire 14 is released to the printed circuit board 56 through the source lead 5 and gate lead 6 and is also released to the printed circuit board 56 through the header 3. This allows efficient radiation of heat and maintains a stable operation of the semiconductor device 1.

Since two leads serve as external terminals in such a surface mount type, the patterns of the connection portions 57 of the printed circuit board 56, i.e., fit patterns, are the same as existing ones, which allows the use of existing printed circuit boards 56.

In the case of insertion mounting, as shown in FIG. 36, the source lead 5 and gate lead 6 are inserted in insertion holes (not shown) provided on the printed circuit board 56 and are secured with solder 59. At this time, as shown in FIG. 36, a radiation fin 60 is overlapped with the header 3, and the header 3 and the radiation fin 60 are engaged and secured with the mounting machine screw 58 inserted through the mounting hole on the header 3. In this structure, any heat generated at the semiconductor chip 7 and the wires 14 is released to the printed circuit board 56 through the source lead 5 and gate lead 6 and is also released into the atmosphere through the header 3 and radiation fin 60. This allows efficient radiation of heat and maintains a stable operation of the semiconductor device 1.

In the seventh embodiment of the invention, any heat generated at the semiconductor chip 7 is efficiently transferred to the source lead 5 through four thick wires 14 and is transferred from the source lead 5 to the printed circuit board 56 as in the first embodiment.

According to the seventh embodiment, the same effects as those of the first embodiment are achieved, and the width W of the wire connection portion 55 of the source lead 5 can be increased because no suspended lead is provided. This facilitates the connection of thick wires and makes it possible to increase the number of connected wires further.

An eighth embodiment of the invention will now be described.

FIGS. 37 through 41 are views relating to a semiconductor device which is another embodiment (eighth embodiment) of the invention.

Figure 37:
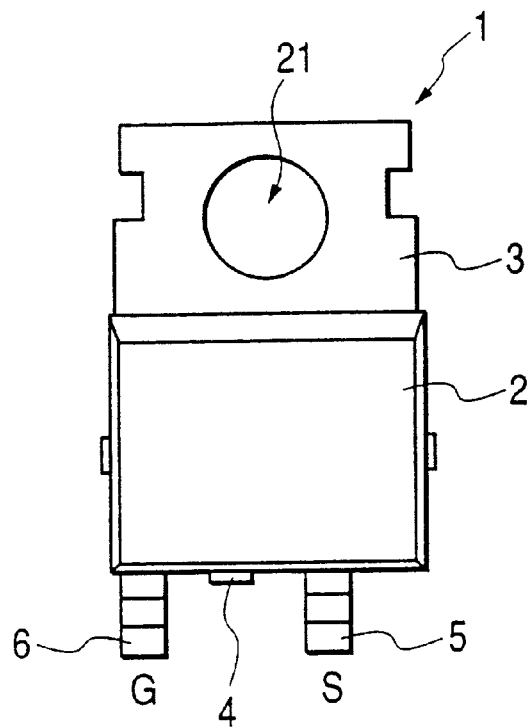
FIG. 37 is a plan view of a semiconductor device which is another embodiment of the invention (eighth embodiment).
Figure 38:
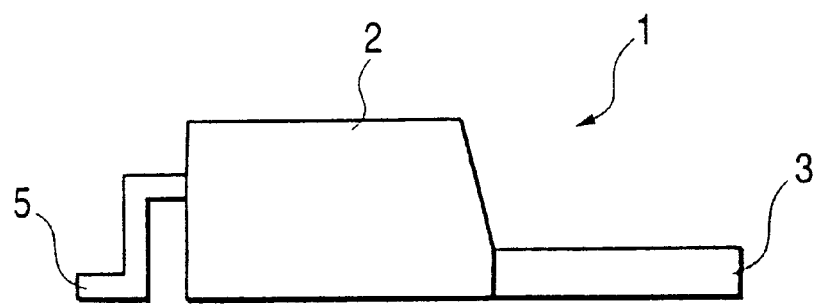
FIG. 38 is a side view of the semiconductor device of the seventh embodiment.

As shown in FIGS. 37 and 38, a semiconductor device 1 of the eighth embodiment has a structure in which one each second electrode lead (source lead) 5 and control electrode lead (gate lead) 6 protrudes from one side of an encapsulation element 2 and in which a support substrate (header) 3 is used as a first electrode (drain electrode), and it thus has a two-terminal configuration.

Figure 39:
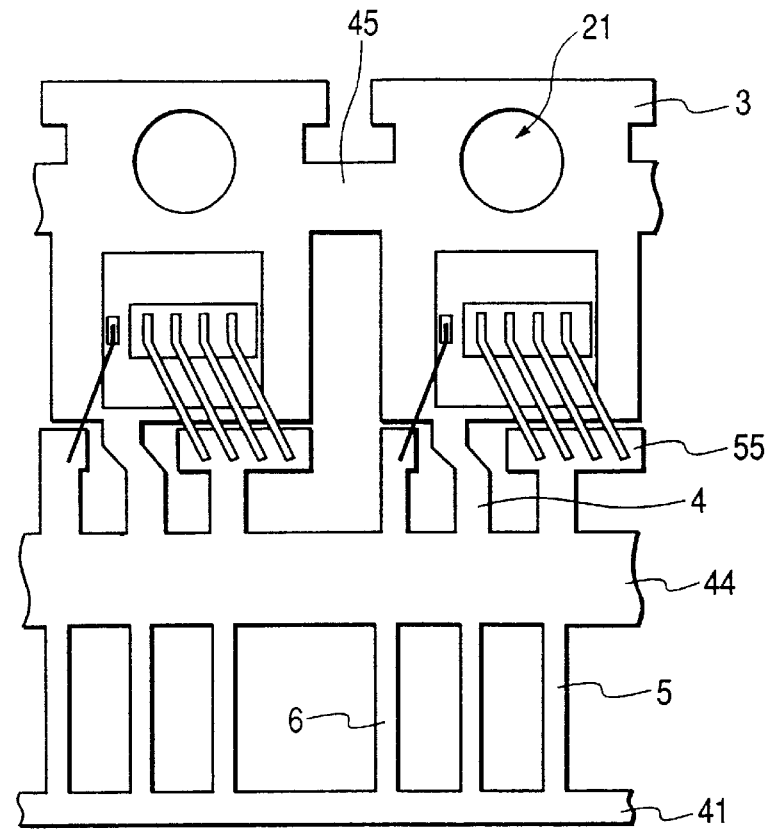
FIG. 39 is a sectional view of a lead frame after wire bonding during the manufacture of the semiconductor device of the eighth embodiment.

As shown in the plan view in FIG. 39, the eighth embodiment employs a lead frame 40 having a suspended lead support structure which is similar to the lead frame 40 in the first embodiment. However, a suspended lead 4 is cut in its region that protrudes from the encapsulation element 2 after molding.

In the semiconductor device 1 of the eighth embodiment, the positions of leads protruding from one side surface of the encapsulation element 2 are biased as a whole to one side of the encapsulation element 2. An advantage is therefore provided in that the encapsulation element 2 can be mounted in a biased position when the semiconductor device 1 is mounted on a printed circuit board.

The lead frame 40 used for the manufacture of a semiconductor device according to the eighth embodiment has a structure in which one source lead 5 is provided in a lead frame 40 as in the first embodiment (see FIG. 8). Specifically, the lead frame 40 of the eighth embodiment has a configuration in which a wide wire connection portion 55 is provided instead of a connecting portion at the inner end of the source lead 5. In order that the wire connection portion 55 has a large width W, the suspended lead 4 has a configuration in which it is bent in the form of a step in the middle thereof toward the gate lead 6.

The three parallel leads, i.e., the gate lead 6, suspended lead 4 and source lead 5 have a constant pitch. For example, the lead pitch is 2.54 mm. As a result, the width W of the wire connection portion 55 can be as large as 4.5 mm.

Since the wire connection portion 55 is large, as shown in FIG. 39, a source electrode 11 of a semiconductor chip 7 and the wire connection portion 55 can be connected by four thick wires 14. Therefore, a small amount of source current flows through each wire to allow a reduction in the amount of heat generated at the source wires and to allow preferable heat transfer to the source lead 5.

The semiconductor device 1 is manufactured in the same manner as in the first embodiment in which, as shown in FIG. 39, a semiconductor chip 7 having a power MOSFET formed thereon is secured to a principal surface of a support substrate 3 as in the first embodiment and, thereafter, the second electrode (source electrode) 11 of the semiconductor chip 7 and the wire connection portion 55 of the source lead 5 are connected by four thick aluminum wires 14. A control electrode (gate electrode) 12 of the semiconductor chip 7 and the end of the gate lead 6 (wire connection portion) are connected by a thin wire 14.

Figure 40:
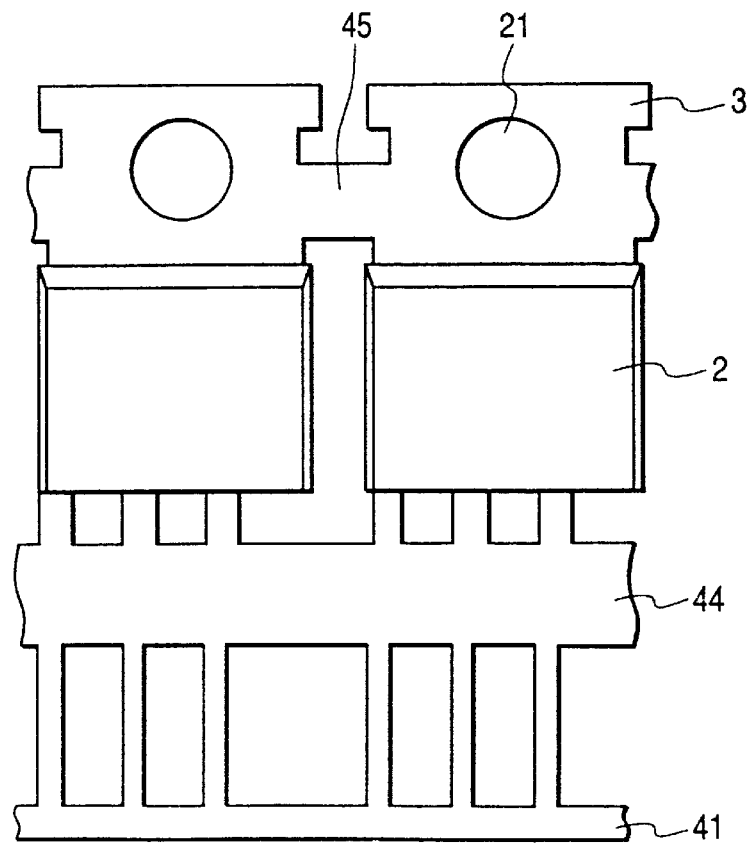
FIG. 40 is a plan view of the lead frame after molding during the manufacture of the semiconductor device of the eighth embodiment.

Next, as shown in FIG. 40, a surface region of a header 3 outside a mounting hole 21 is molded on a transfer molding basis, and the semiconductor chip 7, wires 14 and the regions of the inner ends of the source lead 5 and gate lead 6 (wire connection portion 55) are encapsulated by the encapsulation element 2.

Then, cutting and shaping processes are carried out. Specifically, link portions 45 and a tie bar 44 are cut and removed; the three leads are cut; and the source lead 5 and gate lead 6 are shaped into a gull-wing configuration to manufacture a surface mount type semiconductor device 1 as shown in FIGS. 37 and 38. During the lead cutting, the suspended lead 4 is cut in the region of the joint to the encapsulation element 2.

Figure 41:
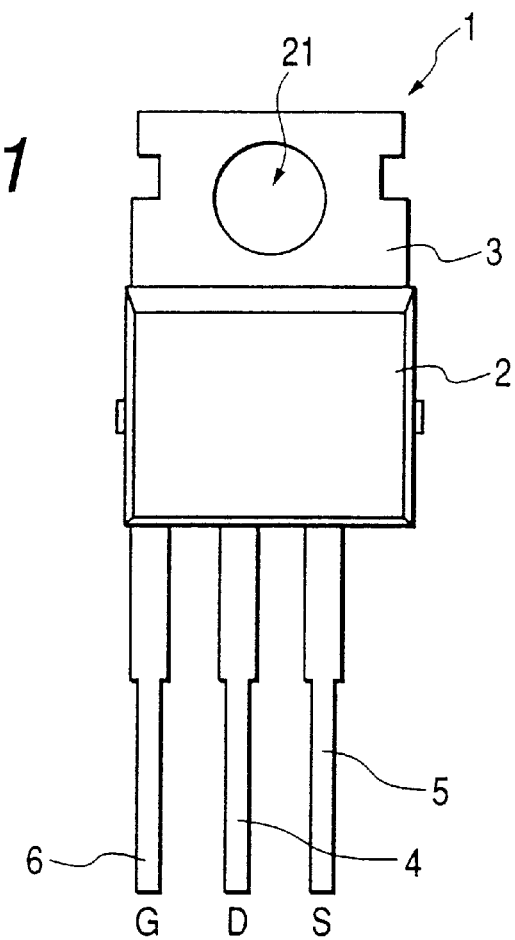
FIG. 41 is a plan view of an insertion mount type semiconductor device which is a modification of the eighth embodiment.

If the three leads are only cut in the vicinity of the outer frame 41, an insertion mounting type semiconductor device 1a having leads extending straightly can be provided as shown in FIG. 41. In this case, the lead in the center, i.e., the suspended lead 4, serves as a drain (D) lead.

The eighth embodiment of the invention provides the same effects as those of the first embodiment.

A ninth embodiment of the invention will now be described.

Figure 42:
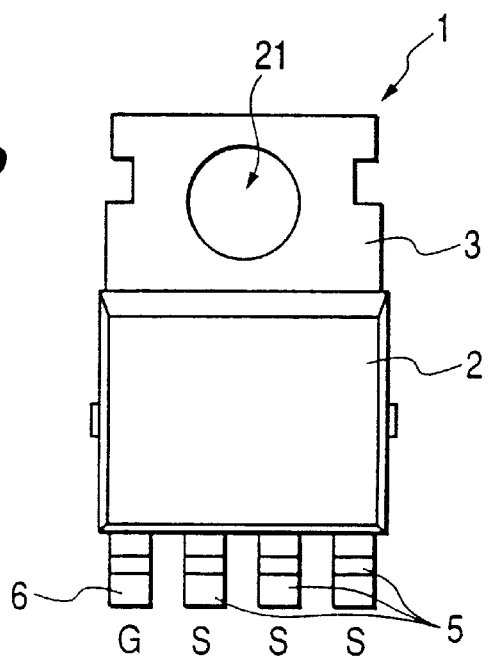
FIG. 42 is a plan view of a semiconductor device which is another embodiment of the invention (ninth embodiment).
Figure 43:
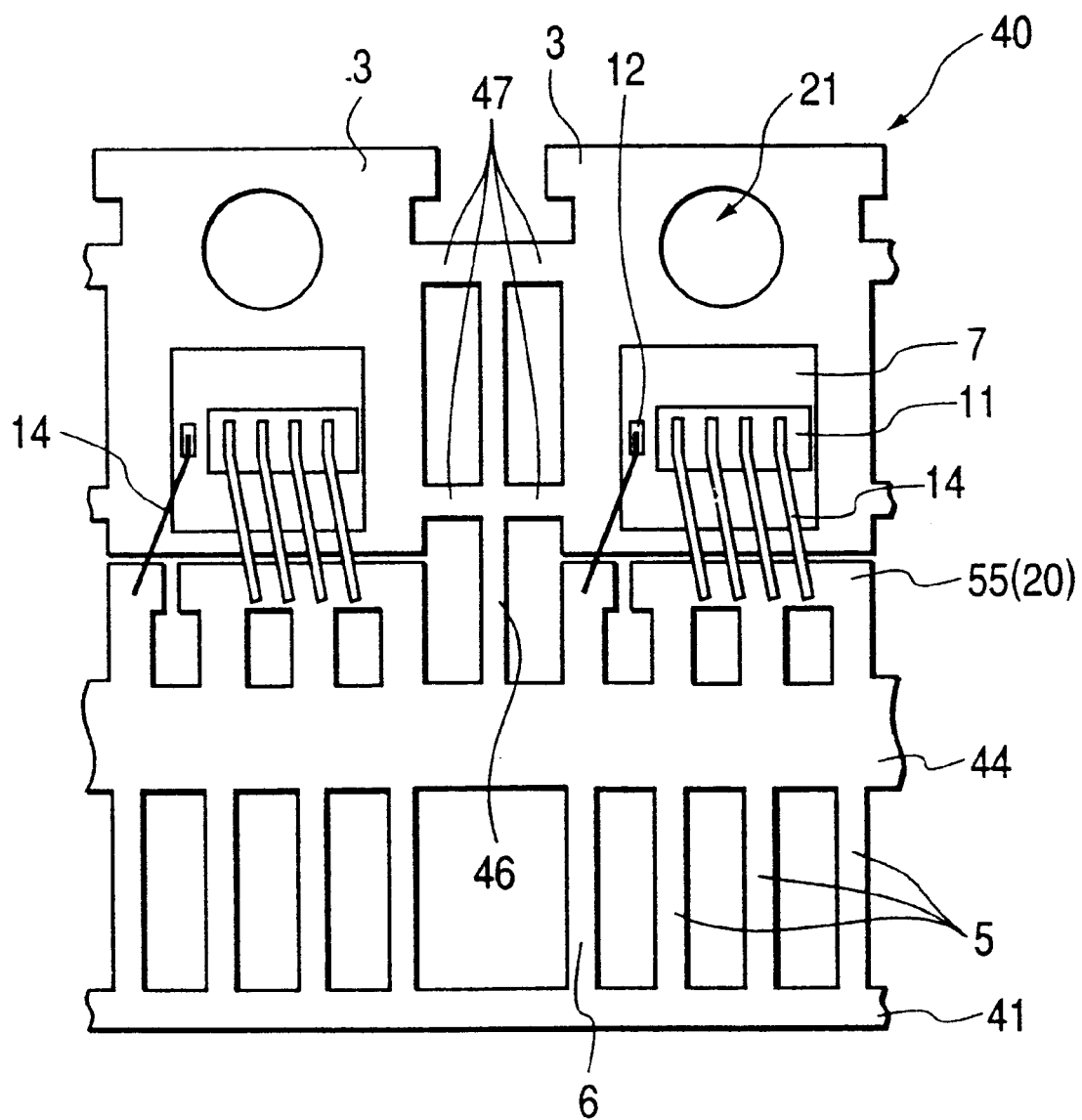
FIG. 43 is a plan view of a lead frame after wire bonding during the manufacture of the semiconductor device of the ninth embodiment.
Figure 44:
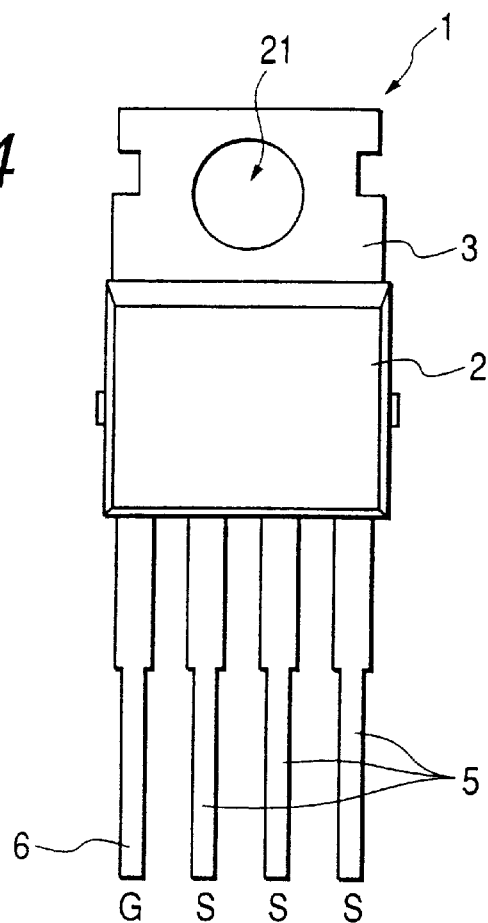
FIG. 44 is a plan view of an insertion mount type semiconductor device which is a modification of the ninth embodiment.

FIGS. 42 through 44 are views relating to a semiconductor device which is another embodiment (ninth embodiment) of the invention.

As shown in FIG. 42, a semiconductor device 1 of the ninth embodiment is a surface mount type in which three source leads 5 and one gate lead 6 protrude from one side of an encapsulation element 2.

As shown in FIG. 43, the semiconductor device 1 of the ninth embodiment is manufactured using a lead frame 40 having a side support structure in which a support substrate 3 is supported by support pieces 47 at both sides thereof as in the seventh embodiment.

As shown in FIG. 43, this lead frame 40 has a pattern in which the single gate lead 6 and the three source leads 5 extend from a tie bar 44 toward the support substrate 3. In this structure, the ends of the source leads 5 are coupled at a coupling portion 20. The coupling portion 20 constitutes a wire connection portion and, in other words, a plurality of leads extend from the wire connection portion 55. The wire connection portion 55 can have a large width because of the use of a side support structure and can be, for example, as wide as 6.5 mm.

Since the wire connection portion 55 is large, as shown in FIG. 43, a source electrode 11 of a semiconductor chip 7 and the wire connection portion 55 can be connected by four thick wires 14. Therefore, a small amount of source current flows through each wire to allow a reduction in the amount of heat generated at the source wires. Further, since there are three source leads 5, improved performance of heat transfer through source leads is achieved, and this provides a high level of thermal diffusion when the semiconductor device 1 is mounted on a printed circuit board to maintain its stable operation. The semiconductor device 1 is manufactured in the same manner as in the seventh embodiment in which, as shown in FIG. 43, a semiconductor chip 7 is secured to a principal surface of a support substrate 3 and, thereafter, the source electrode 11 of the semiconductor chip 7 and the wire connection portion 55 of the source leads 5 are connected by four thick aluminum wires 14 and a gate electrode 12 of the semiconductor chip 7 and the end of the gate lead 6 are connected by a thin wire 14.

Thereafter, although not shown, a surface region of the header 3 outside a mounting hole 21 is molded on a transfer molding basis, and the semiconductor chip 7, wires 14 and the wire connection portion 55 of the source leads 5 and gate lead 6 are encapsulated by the encapsulation element 2. Cutting and shaping processes are subsequently performed on the region of the lead frame to manufacture a semiconductor device 1 as shown in FIG. 42.

If the four leads are only cut in the vicinity of the outer frame 41, as shown in FIG. 44, an insertion mount type semiconductor device 1 having straightly extending leads can be provided.

The ninth embodiment of the invention provides the same effects as those of the first embodiment.

A tenth embodiment of the invention will now be described.

Figure 45:
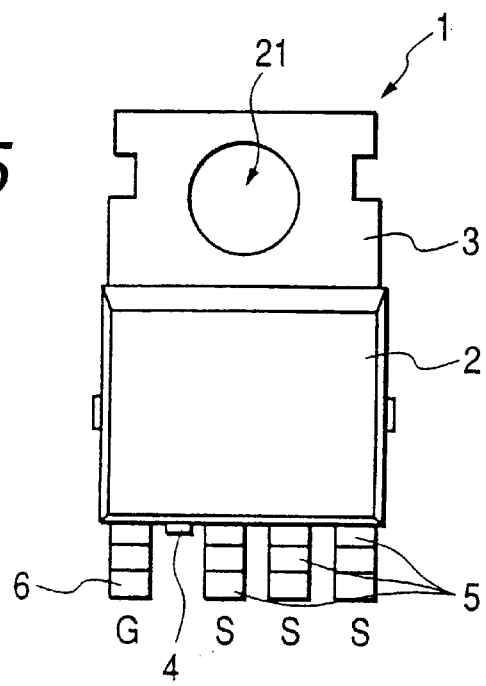
FIG. 45 is a plan view of a semiconductor device which is another embodiment of the invention (tenth embodiment).
Figure 46:
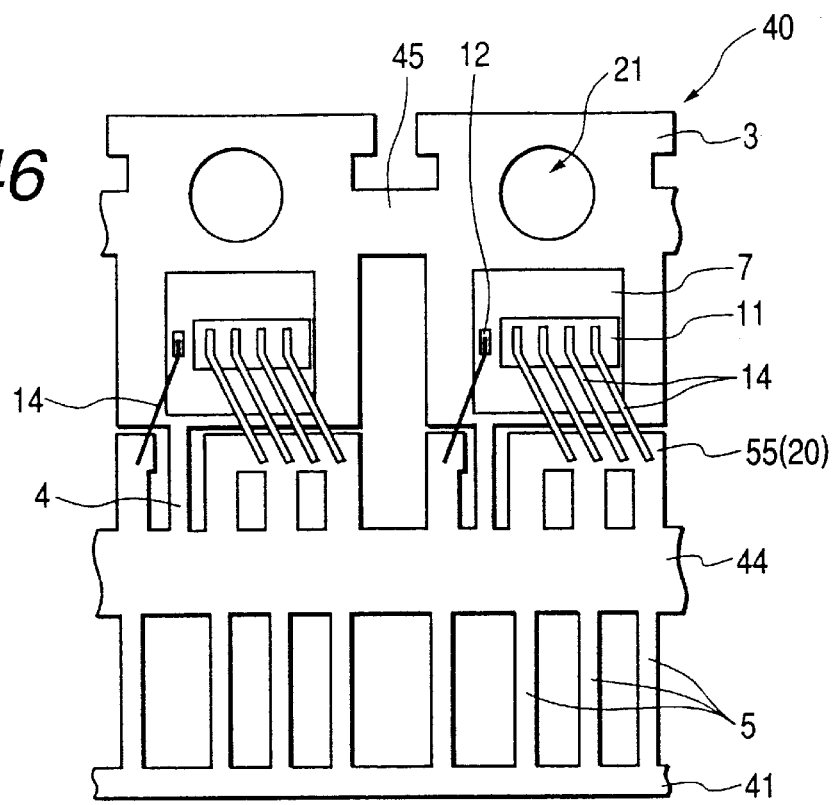
FIG. 46 is a plan view of a lead frame after wire bonding during the manufacture of the semiconductor device of the tenth embodiment.
Figure 47:
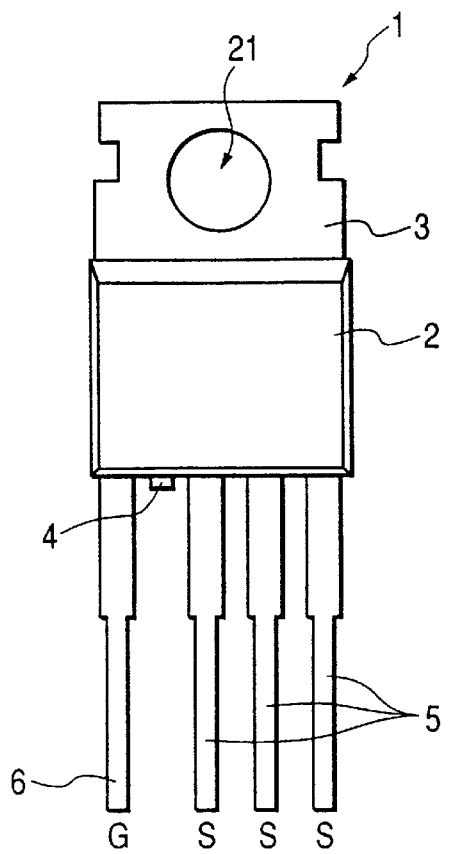
FIG. 47 is a plan view of an insertion mount type semiconductor device which is a modification of the tenth embodiment.

FIGS. 45 through 47 are views relating to a semiconductor device which is another embodiment (tenth embodiment) of the invention.

As shown in FIG. 45, a semiconductor device 1 of the tenth embodiment is a surface mount type in which three source leads 5 and one gate lead 6 protrude from one side of an encapsulation element 2. As shown in the plan view in FIG. 46, the tenth embodiment employs a lead frame 40 having a suspended lead support structure similar to the lead frame 40 of the first embodiment. However, the suspended lead 4 is cut in the region thereof that protrudes from the encapsulation element 2 after molding as shown in FIG. 45.

As shown in FIG. 46, the lead frame 40 used in the semiconductor device 1 of the tenth embodiment has a pattern in which the single gate lead 6, the single suspended lead 4 and the three source leads 5 extend from a tie bar 44 toward the support substrate 3. The leads are at unequal pitches.

In this structure, the ends of the source leads 5 are coupled at a coupling portion 20. The coupling portion 20 constitutes a wire connection portion 55 and, in other words, a plurality of leads extend from the wire connection portion 55. The width of the wire connection portion 55 can be, for example, as large as 5.8 mm.

The semiconductor device 1 is manufactured in the same method as the eighth embodiment. If the four leads (the source leads 5 and gate lead 6) are only cut in the vicinity of the outer frame 41 without being subjected to lead shaping during lead cutting, an insertion mount type semiconductor device 1 as shown in FIG. 47 can be provided.

The tenth embodiment can also provide the same effects as those of the first embodiment. It makes it possible to prevent thermal damage to the encapsulation element and to maintain a stable operation of the semiconductor device 1.

An eleventh embodiment of the invention will now be described.

Figure 48:
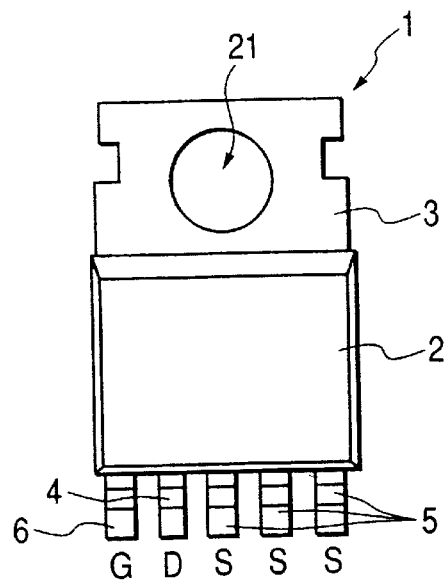
FIG. 48 is a plan view of a semiconductor device which is another embodiment of the invention (eleventh embodiment).
Figure 49:
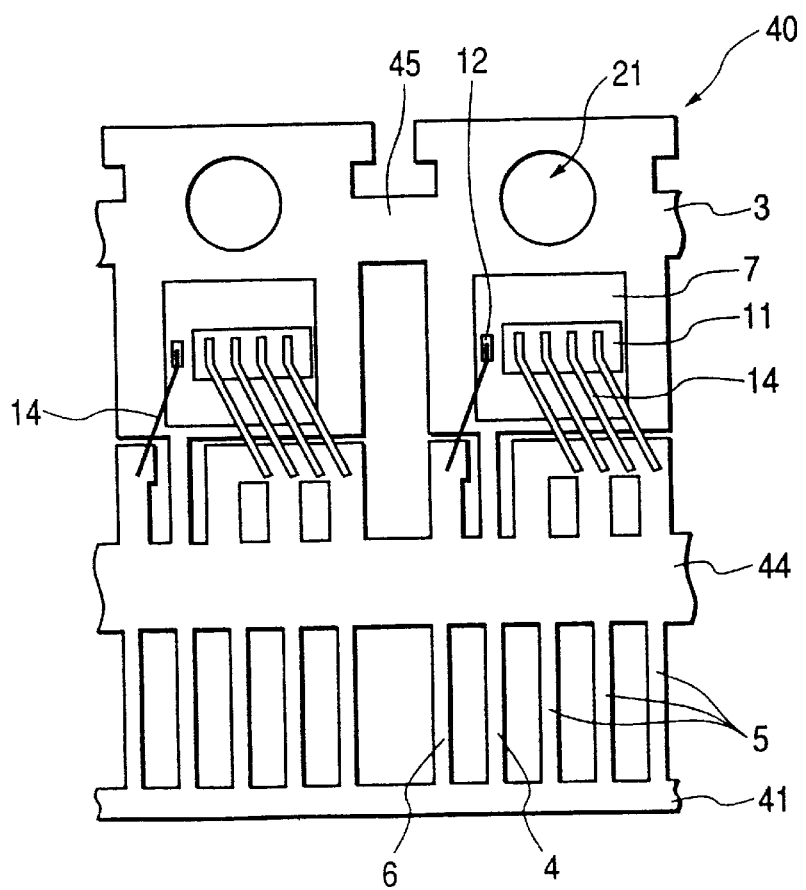
FIG. 49 is a plan view of a lead frame after wire bonding during the manufacture of the semiconductor device of the eleventh embodiment.
Figure 50:
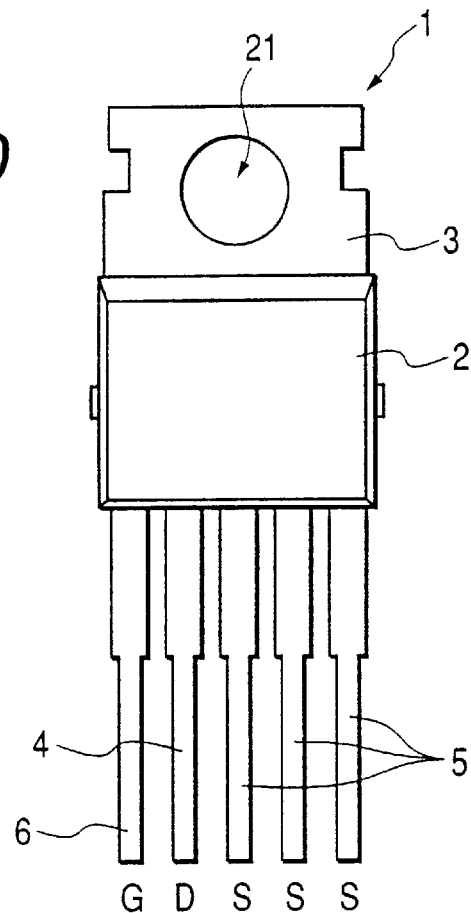
FIG. 50 is a plan view of an insertion mount type semiconductor device which is a modification of the eleventh embodiment.

FIGS. 48 through 50 are views relating to a semiconductor device which is another embodiment (eleventh embodiment) of the invention.

The eleventh embodiment is different from the tenth embodiment in that it has a constant lead pitch and in that a suspended lead 4 is used as a drain lead. Specifically, FIG. 48 shows a surface mount type semiconductor device 1, and FIG. 50 shows an insertion mount type semiconductor device 1.

In the surface mount type semiconductor device 1, the suspended lead 4 may be used by cutting it in the region of the joint to an encapsulation element 2.

FIG. 49 shows a lead frame 40 used in the eleventh embodiment. In the present embodiment, after a semiconductor chip 7 is secured and wires 14 are connected and molded, the suspended lead 4 is used as a lead instead of being cut in the region in the vicinity of (the joint to) the encapsulation element 2.

The eleventh embodiment can also provide the same effects as those of the first embodiment. It makes it possible to prevent thermal damage to the encapsulation element and to maintain a stable operation of the semiconductor device 1.

A twelfth embodiment of the invention will now be described.

Figure 51:
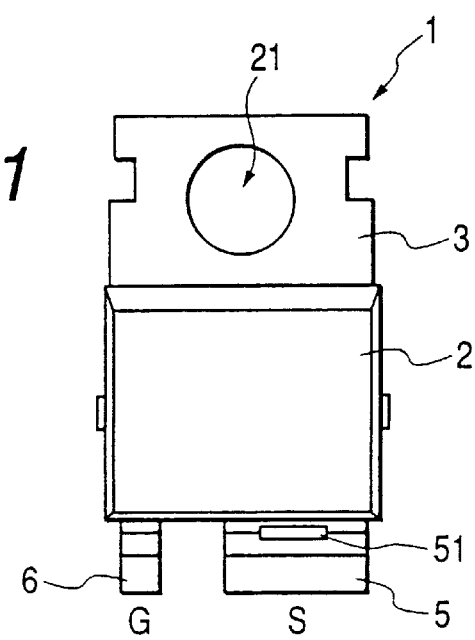
FIG. 51 is a plan view of a semiconductor device which is another embodiment of the invention (twelfth embodiment).
Figure 52:
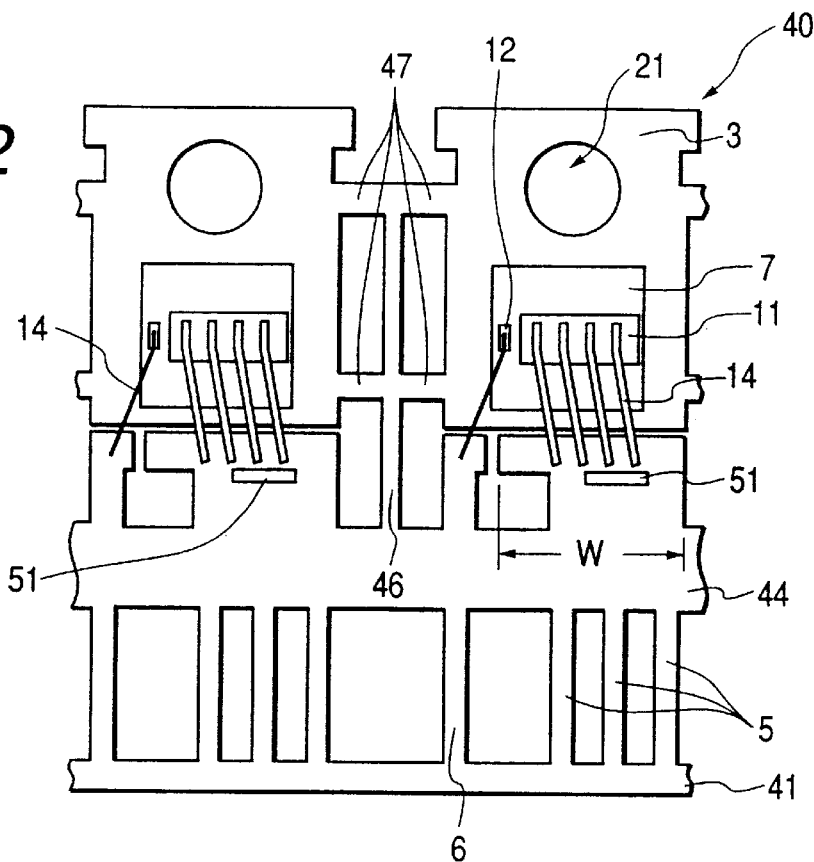
FIG. 52 is a plan view of a lead frame after wire bonding during the manufacture of the semiconductor device of the twelfth embodiment.
Figure 53:
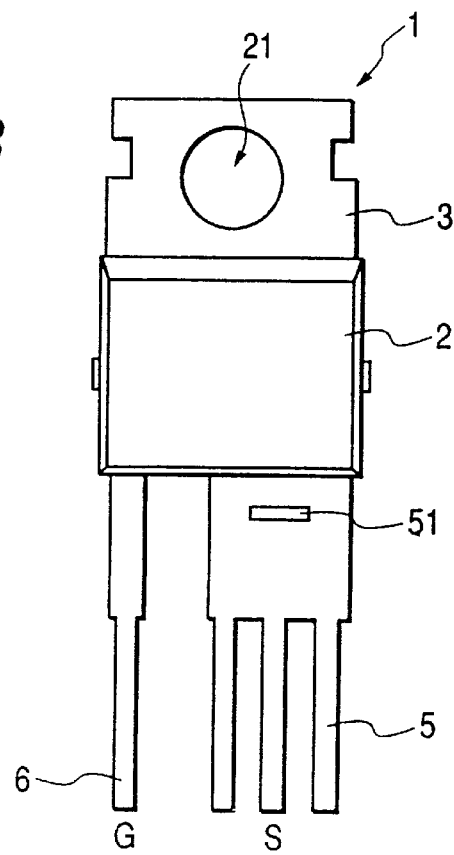
FIG. 53 is a plan view of an insertion mount type semiconductor device which is a modification of the twelfth embodiment.

FIGS. 51 through 53 are views relating to a semiconductor device which is another embodiment (twelfth embodiment) of the invention.

As shown in FIG. 51, a semiconductor device 1 of the twelfth embodiment is a surface mount type in which one wide source lead 5 and one gate lead 6 protrude from one side of an encapsulation element 2.

The semiconductor device 1 of the twelfth embodiment is manufactured by using a lead frame 40 having a side support structure in which a support substrate 3 is supported by support pieces 47 at both sides thereof as shown in FIG. 52 as in the seventh embodiment.

As shown in FIG. 52, the lead frame 40 has a pattern in which the one gate lead 6 and the one wide source lead 5 extend from a tie bar 44 toward the support substrate 3. The width of the source lead 5 is increased further in a wire connection portion 55 at the end thereof. A hole 51 for uniform bending is provided in the middle of the source lead 5 as in the fourth embodiment in order to bend the wide source lead 5 easily.

Since the lead frame 40 has a side support structure, the width W of the wire connection portion 55 of the source lead 5 can be increased further. For example, the width W can be as large as 7.0 mm.

The method for manufacturing the semiconductor device 1 is the same as that in the seventh embodiment.

If four leads are only cut in the vicinity of an outer frame 4, an insertion mount type semiconductor device 1 can be obtained as shown in FIG. 53. In this case, the end of the wide source lead 5 must be adapted to insertion mounting. An outer lead region of the lead frame 40 that extends outwardly from the tie bar 44 can be used as it is as this region for insertion mounting. That is, the inner lead region has a large width, whereas an outer lead region may be a conventional lead pattern.

The twelfth embodiment can also provide the same effects as those of the first embodiment. In addition, since the wire connection portion 55 of the source lead 5 can have a large width W, it is possible to provide a large contact area between the lead and a retaining portion of a lead frame retainer for retaining the lead frame during wire bonding. Since this makes it possible to retain both ends of the wire connection portion 55 with rigidly, the performance of ultrasonic bonding can be improved to improve the strength of wire bonding.

A description will now be made with reference to thirteenth through nineteenth embodiments of the invention on semiconductor devices having a structure in which the support substrate is cut in the vicinity of the encapsulation element. Most of those embodiment employ a structure that includes a structure according to any of the above-described embodiments.

Those semiconductor devices are manufactured by using lead frames used in the above-described embodiments and by cutting the support substrate in the vicinity of the encapsulation element after molding.

In a structure in which a support substrate is cut in the vicinity of an encapsulation element, the support substrate protrudes from the encapsulation element by several millimeters, which is in compliance with TO-262AA, TO-263AB, TO268AA and the like according to JEDEC specifications.

The figures of lead frames schematically show the region of a support substrate and the ends of lead extending toward the support substrate. Although not shown, four thick wires are connected in parallel to a wire connection portion of a source lead.

A thirteenth embodiment of the invention will now be described.

Figure 54:
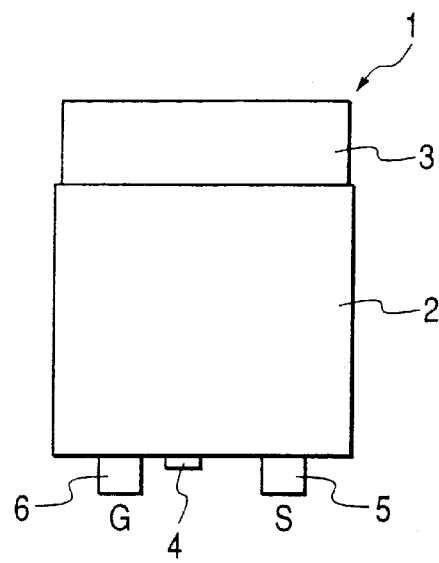
FIG. 54 is a plan view of a semiconductor device which is another embodiment of the invention (thirteenth embodiment).
Figure 55:
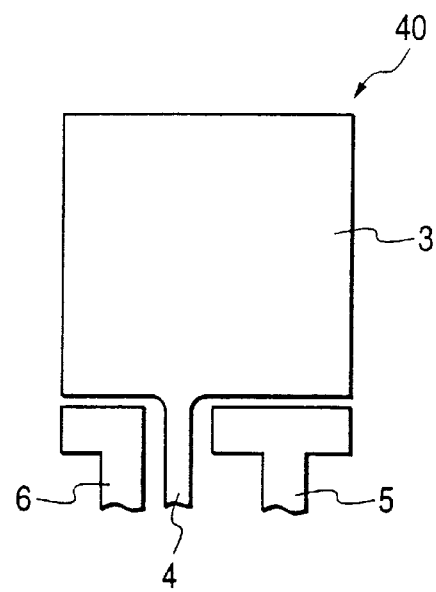
FIG. 55 is a plan view of a part of a lead frame used for the manufacture of the semiconductor device of the thirteenth embodiment.

As shown in FIG. 54, the thirteenth embodiment is a surface mount type semiconductor device 1 in which one each gate lead 6 and source lead 5 protrudes from one side of an encapsulation element 2. In the thirteenth embodiment, the interval between a suspended lead 4 and the source lead 5 is greater than the interval between the suspended lead 4 and the gate lead 6. This structure is in compliance with the lead pitch specifications for three terminals (JEDEC specifications).

Since the thirteenth embodiment employs four source wires, the encapsulation element made of resin is less susceptible to deterioration attributable to the generation of heat at the region of the source wires, and improved heat transfer characteristics allows the semiconductor device to maintain a stable operation.

A fourteenth embodiment of the invention will now be described.

Figure 56:
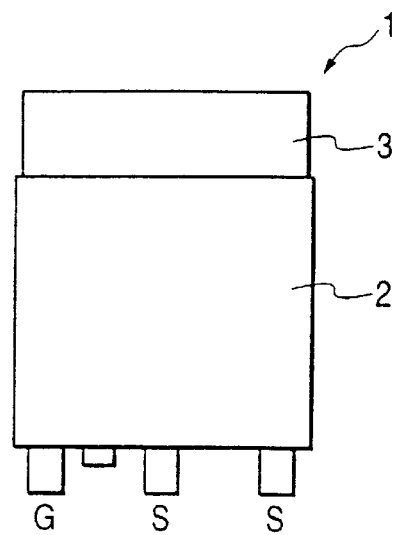
FIG. 56 is a plan view of a semiconductor device which is another embodiment of the invention (fourteenth embodiment).
Figure 57:
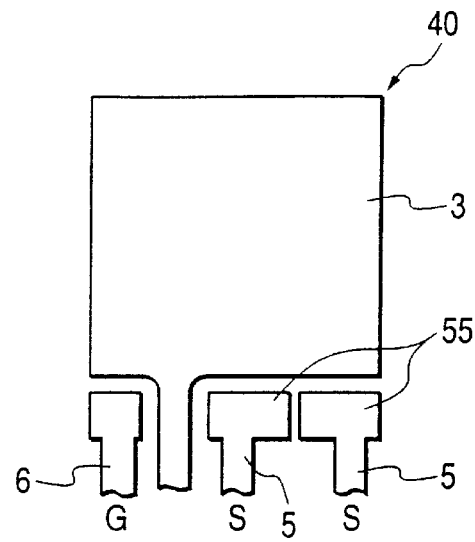
FIG. 57 is a plan view of a part of a lead frame used for the manufacture of the semiconductor device of the fourteenth embodiment.

FIG. 56 is a plan view of a semiconductor device which is another embodiment (fourteenth embodiment) of the invention, and FIG. 57 is a plan view of a part of a lead frame used to manufacture the semiconductor device. The fourteenth embodiment has a structure in which two source leads 5 are provided; each of the source leads 5 has a wide wire connection portion 55 in an encapsulation element 2; and the two wire connection portions 55 are discontinuous. A greater number of source leads may be used. In this case, each source lead 5 may be connected to a single wire connection portion 55 and, alternatively, a structure may be employed in which a plurality of source leads 5 extend from a single wire connection portion 55.

Since the fourteenth embodiment also employs four source wires, the encapsulation element made of resin is less susceptible to deterioration attributable to the generation of heat at the region of the source wires, and improved heat transfer characteristics allows the semiconductor device to maintain a stable operation.

A fifteenth embodiment of the invention will now be described.

Figure 58:
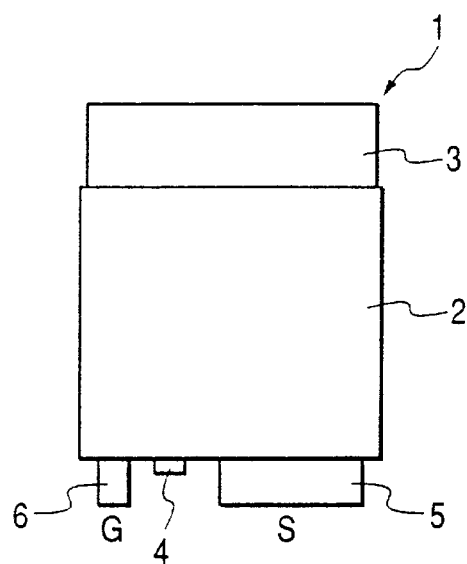
FIG. 58 is a plan view of a semiconductor device which is another embodiment of the invention (fifteenth embodiment).
Figure 59:
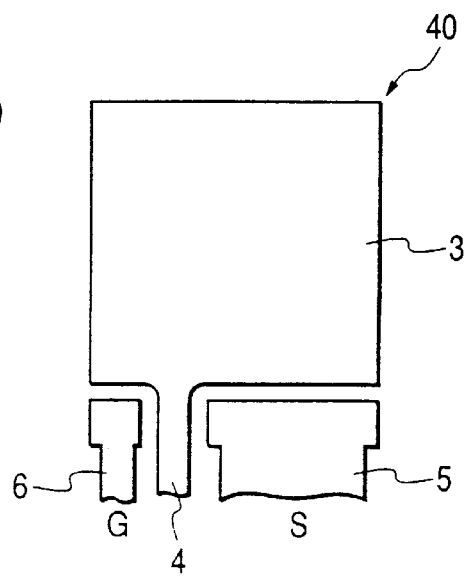
FIG. 59 is a plan view of a part of a lead frame used for the manufacture of the semiconductor device of the fifteenth embodiment.

FIG. 58 is a plan view of a semiconductor device which is another embodiment (fifteenth embodiment) of the invention, and FIG. 59 is a plan view of a part of a lead frame used to manufacture the semiconductor device. The fifteenth embodiment employs a wide source lead 5. This significantly improves performance of heat transfer through the source lead 5.

Since the fifteenth embodiment also employs four source wires, the encapsulation element made of resin is less susceptible to deterioration attributable to the generation of heat at the region of the source wires, and the use of a wide source lead improves heat transfer characteristics further and allows the semiconductor device to maintain a stable operation.

A sixteenth embodiment of the invention will now be described.

Figure 60:
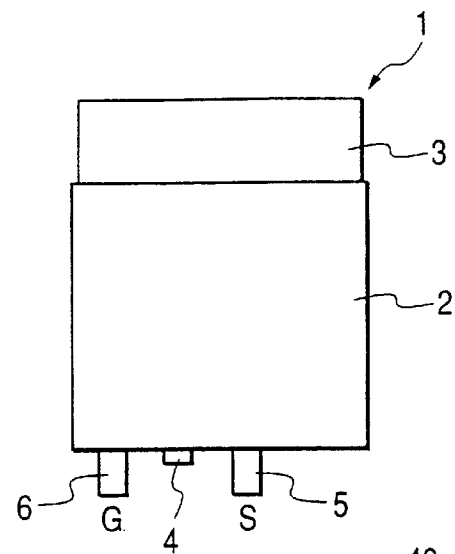
FIG. 60 is a plan view of a semiconductor device which is another embodiment of the invention (sixeenth embodiment).
Figure 61:
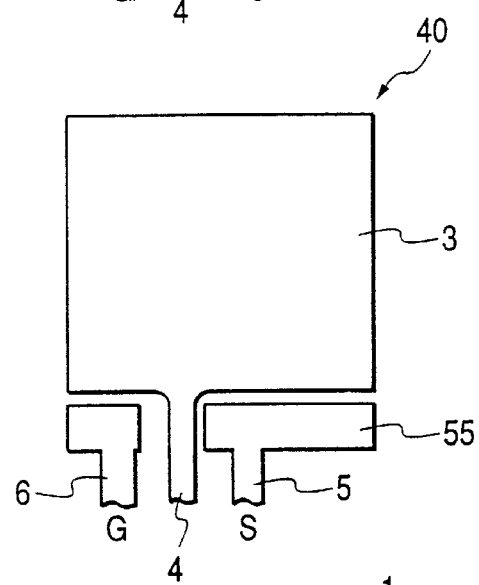
FIG. 61 is a plan view of a part of a lead frame used for the manufacture of the semiconductor device of the sixteenth embodiment.

FIG. 60 is a plan view of a semiconductor device which is another embodiment (sixteenth embodiment) of the invention, and FIG. 61 is a plan view of a part of a lead frame used to manufacture the semiconductor device. In the sixteenth embodiment, leads protruding from one side surface of an encapsulation element 2 are provided in a position biased toward one side of the encapsulation element 2 as a whole like the eighth embodiment. This is advantageous in that the semiconductor device 1 can be mounted on a printed circuit board with the encapsulation element 2 mounted in a biased position.

Figure 62:
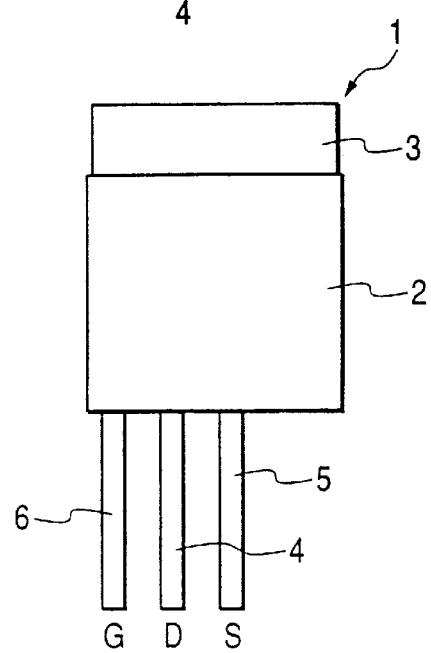
FIG. 62 is a plan view of an insertion mount type semiconductor device which is a modification of the sixteenth embodiment.

As shown in FIG. 62, an insertion type semiconductor device can be also manufactured in which a suspended lead 4 is used as a drain lead instead of being cut and removed. The suspended lead 4 may be used as a drain lead also in a surface mount type by shaping it into a gull-wing configuration.

Since the sixteenth embodiment also employs four source wires, the encapsulation element made of resin is less susceptible to deterioration attributable to the generation of heat at the region of the source wires, and improved heat transfer characteristics allows the semiconductor device to maintain a stable operation.

Further, this structure is in compliance with the lead pitch specifications for three terminals (JEDEC specifications).

A seventeenth embodiment of the invention will now be described.

Figure 63:
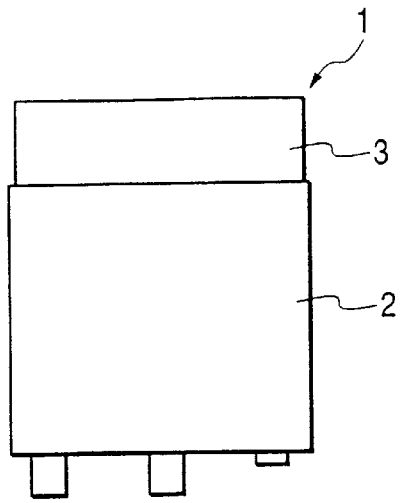
FIG. 63 is a plan view of a semiconductor device which is another embodiment of the invention (seventeenth embodiment).
Figure 64:
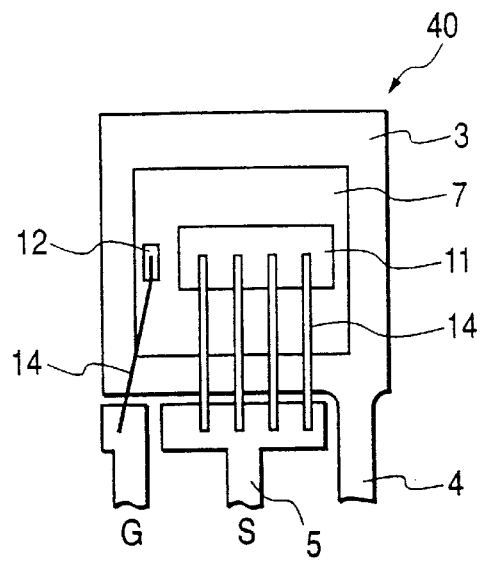
FIG. 64 is a plan view of a lead frame after wire bonding during the manufacture of the semiconductor device of the seventeenth embodiment.

FIG. 63 is a plan view of a semiconductor device which is another embodiment (seventeenth embodiment) of the invention, and FIG. 64 is a plan view of a part of a lead frame after wire bonding used to manufacture the semiconductor device.

In the seventeenth embodiment, a source lead 5 is provided in the center. This makes it possible to reduce the length of thick wires 14 to connect a wire connection portion 55 of the source lead 5 and a source electrode 11 of a semiconductor chip 7 as shown in FIG. 64, thereby allowing a reduction of the resistance of the source wires.

Since the seventeenth embodiment also employs four source wires, the encapsulation element made of resin is less susceptible to deterioration attributable to the generation of heat at the region of the source wires, and improved heat transfer characteristics allows the semiconductor device to maintain a stable operation.

An eighteenth embodiment of the invention will now be described.

Figure 65:
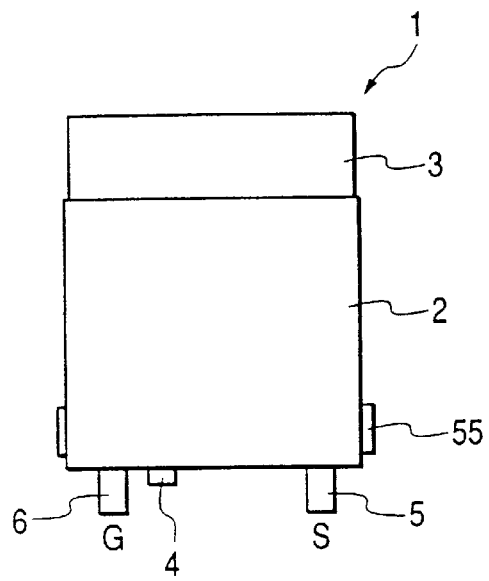
FIG. 65 is a plan view of a semiconductor device which is another embodiment of the invention (eighteenth embodiment).
Figure 66:
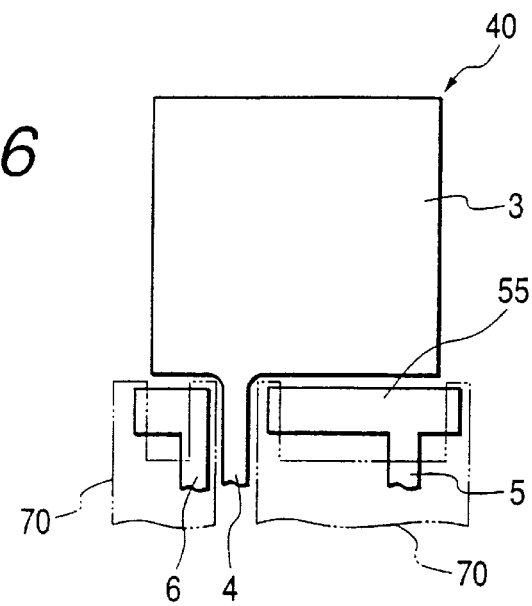
FIG. 66 is a plan view of a part of a lead frame used for the manufacture of the semiconductor device of the eighteenth embodiment.

FIG. 65 is a plan view of a semiconductor device which is another embodiment (eighteenth embodiment) of the invention, and FIG. 66 is a plan view of a part of a lead frame used to manufacture the semiconductor device. In the eighteenth embodiment, the ends of a wire connection portion of a source lead 5 and a wire connection portion 55 of a gate lead 6 protrude from an encapsulation element 2 by a small distance within the range from 0.5 to 0.7 mm.

As shown in FIG. 66, when wire bonding is carried out by applying ultrasonic ware to the end of the wire connection portion of the gate lead 6 and the end of the wire connection portion 55 of the source lead 5 retained with a lead frame retainer 70 having a configuration as indicated by the two-dot chain line, a large contact area can be provided between the lead frame retainer 70 and the leads. This makes it possible to retain the wire connection portion 55 rigidly at both ends thereof, thereby improving the performance of ultrasonic bonding and improving the strength of wire bonding.

As a result, the strength of wire bonding, yield and reliability can be improved.

Since the eighteenth embodiment also employs four source wires, the encapsulation element made of resin is less susceptible to deterioration attributable to the generation of heat at the region of the source wires, and improved heat transfer characteristics allows the semiconductor device to maintain a stable operation.

A nineteenth embodiment of the invention will now be described.

Figure 67:
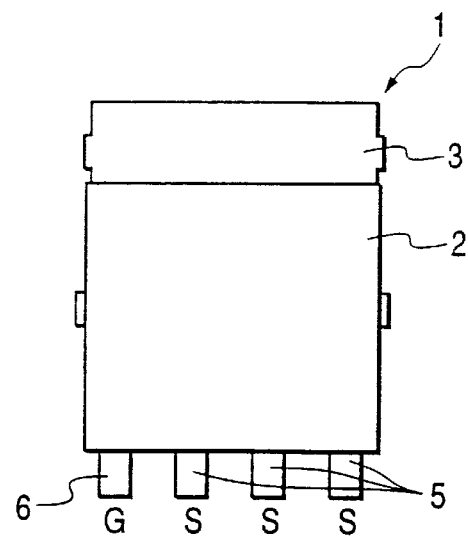
FIG. 67 is a plan view of a semiconductor device which is another embodiment of the invention (nineteenth embodiment).
Figure 68:
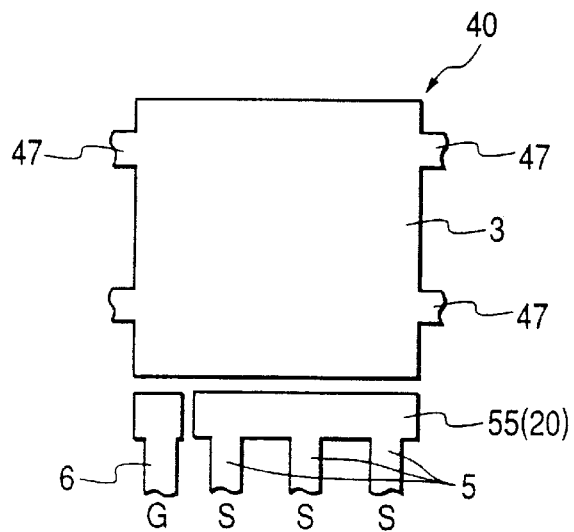
FIG. 68 is a plan view of a part of a lead frame used for the manufacture of the semiconductor device of the nineteenth embodiment.

FIG. 67 is a plan view of a semiconductor device which is another embodiment (nineteenth embodiment) of the invention, and FIG. 68 is a plan view of a part of a lead frame used to manufacture the semiconductor device. The nineteenth embodiment corresponds to the ninth embodiment in which a support substrate 3 includes a mounting hole 21 and is a semiconductor device 1 having three source leads 5.

Since the nineteenth embodiment also employs four source wires, the encapsulation element made of resin is less susceptible to deterioration attributable to the generation of heat at the region of the source wires, and improved heat transfer characteristics allows the semiconductor device to maintain a stable operation.

A twentieth embodiment of the invention will now be described.

Figure 69:
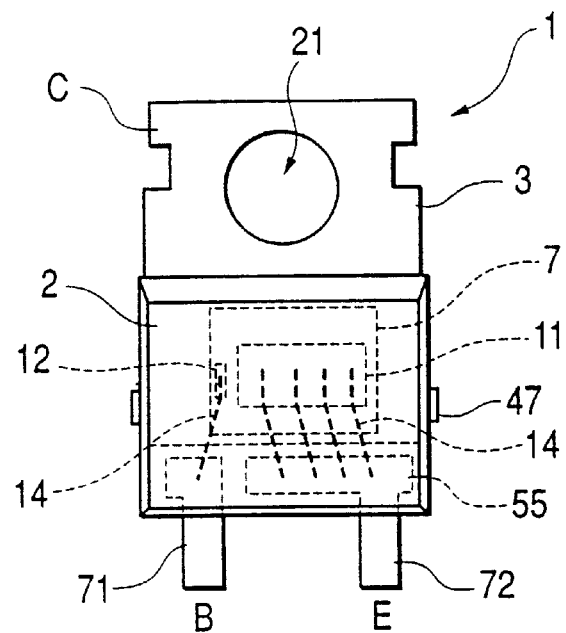
FIG. 69 is a plan view of a semiconductor device which is another embodiment of the invention (twentieth embodiment).

FIG. 69 is a plan view of a semiconductor device which is another embodiment (twentieth embodiment) of the invention. The twentieth embodiment is a semiconductor device 1 according to the seventh embodiment in which a semiconductor chip 7 incorporating a power bipolar transistor is secured to a support substrate 3 and in which leads protruding from one side of an encapsulation element 2 are a base (B) lead 71 and an emitter (E) lead 72. The support substrate 3 is used as a collector (C) terminal.

Since the twentieth embodiment also employs four emitter wires, the encapsulation element made of resin is less susceptible to deterioration attributable to the generation of heat at the region of the emitter wires, and improved heat transfer characteristics allows the semiconductor device to maintain a stable operation.

A twenty first embodiment of the invention will now be described.

Figure 70:
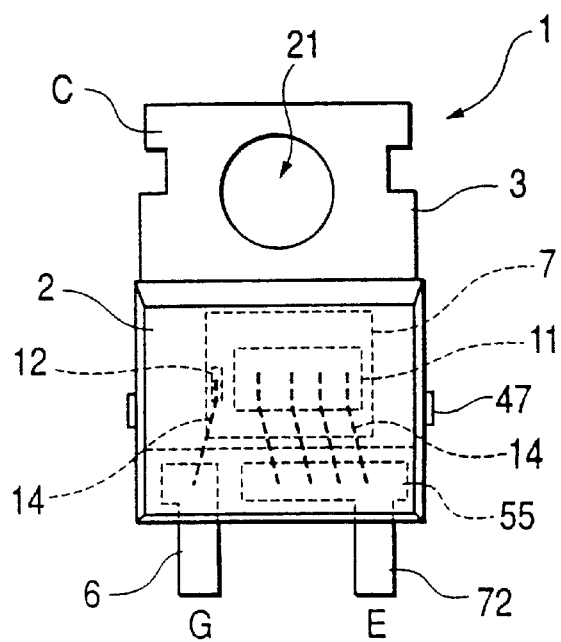
FIG. 70 is a plan view of a semiconductor device which is another embodiment of the invention (twenty first embodiment).

FIG. 70 is a plan view of a semiconductor device which is another embodiment (twenty first embodiment) of the invention. The twenty first embodiment is a semiconductor device 1 according to the seventh embodiment in which a semiconductor chip 7 incorporating an IGBT is secured to a support substrate 3 and in which leads protruding from one side of an encapsulation element 2 are a gate lead 6 and an emitter (E) lead 72. The support substrate 3 is used as a collector (C) terminal.

Since the twenty first embodiment also employs four emitter wires, the encapsulation element made of resin is less susceptible to deterioration attributable to the generation of heat at the region of the emitter wires, and improved heat transfer characteristics allows the semiconductor device to maintain a stable operation.

While the invention conceived by the inventors has been specifically described based on preferred embodiments thereof, the present invention is not limited to the above-described embodiments and may obviously modified in various ways within the scope of principles thereof.

A semiconductor device according to the invention may be incorporated in various electronic apparatuses as a surface mount structure or insertion mount structure. For example, it may be used in power supplies of portable apparatuses, notebook type personal computers and the like which must operate at a low voltage, power supplies of laser beam printers and the like which must have low thermal resistance and power supplies of car electronics and the like which require high currents in the range from 100 to 120 A. The present invention can be applied at least to semiconductor devices having structures in accordance with TO-220.

Effects achievable by typical aspects of the invention described in this specification can be briefly summarized as follows.

(1) Two second electrode leads (source leads) are provided to increase a heat transfer sectional area, thereby increasing the amount of heat transferred to a printed circuit board. This improves the heat transferring effect and allows a stable operation of transistors such as power MOSFETS, power bipolar transistors and IGBTS.

(2) Two source leads are coupled at an elongate coupling portion in an encapsulation element, and four thick aluminum wires (having a diameter of 500 $\mu$m) are connected to the coupling portion. As a result, even if the drain current increases to a value (100 A) significantly higher than that in the prior art, power loss can be suppressed to suppress the amount of heat generated. This makes it possible to prevent deterioration of resin that constitutes an encapsulation element and to expand the life of a power MOSFET.

(3) Since heat generated at the wires and heat generated at a semiconductor chip is transferred to a printed circuit board through four thick wires and through two source leads that improve the heat transferring effect, effective radiation of heat can be achieved.

(4) When a wide second electrode lead is used, the radiation performance is further improved to allow a stable operation of a transistor to be maintained.

What is claimed is:

1. A method of manufacturing a semiconductor device comprising the steps of:
   (a) providing a plurality of semiconductor chips each having a first surface and a second surface opposite to said first surface, a gate electrode and a source electrode formed on said first surface, respectively and a drain electrode formed on said second surface;
   (b) providing a lead frame having a plurality of units arranged in a line, each of said plurality of units having a gate lead, a source lead and a chip support substrate as a drain lead, each of said gate and source leads extending in a direction substantially perpendicular to a direction of said line and having an inner lead portion and an outer lead portion which is continuously formed with said inner lead portion, ends of said inner lead portions of said gate and source leads being spaced from said chip support substrate in said perpendicular direction, said gate and source leads of each of said plurality of units being coupled with one another by a tie bar portion of said lead frame, said tie bar portion extending in the direction of said line at a boundary of said inner and outer lead portions, each of said chip support substrates of said plurality of units being coupled with said tie bar portion by one of a plurality of support leads of said lead frame, each said support lead being disposed between adjacent ones of said plurality of units in the direction of said line;

(c) mounting said plurality of semiconductor chips on said chip support substrates of said plurality of units respectively such that said second surface of said semiconductor chip is adhered to an upper surface of the corresponding chip support substrate;

(d) electrically connecting said gate electrode with said inner lead portion of said gate lead by a first wire in each of said plurality of units;

(e) electrically connecting said source electrode with said inner lead portion of said source lead by second wires in each of said plurality of units;

(f) sealing said semiconductor chip, said inner lead portion and said first and second wires by a resin member in each of said plurality of units, said outer lead portion, said tie bar portion and each said support lead protruding outwardly from said resin member respectively, (g) after step (f), cutting each said support lead and said tie bar portion of said lead frame, thereby providing a plurality of semiconductor packages each having said semiconductor chip, said gate, source and drain leads, and said first and second wires.

2. A method of manufacturing a semiconductor device according to claim 1, wherein said end of said inner lead portion of said source lead is wider than the other portion of said inner lead portion of said source lead in the direction of said line, wherein said second wires are connected with said end of said inner lead portion of said source lead.

3. A method of manufacturing a semiconductor device according to claim 2, wherein a number of said second wires is three or more.

4. A method of manufacturing a semiconductor device according to claim 3, wherein each of said second wires is made of aluminum.

5. A method of manufacturing a semiconductor device according to claim 4, wherein said support substrate as said drain lead has a plate-like shape, and wherein a rear surface of said drain lead is exposed from said rear surface of said resin member.

6. A method of manufacturing a semiconductor device according to claim 1, wherein, before step (g) is performed, each support lead includes a first support piece that is disposed between adjacent ones of said plurality of units, extends perpendicularly to the direction of said line, and supportingly connects the chip support substrate of each of said adjacent units to said tie bar portion; and a second support piece that is disposed between adjacent ones of said plurality of units, extends in parallel to the direction of said line, and directly supportingly connects together said chip support substrates of said adjacent units.

7. A method of manufacturing a semiconductor device according to claim 6, wherein said first support piece has first and second ends, and before step (g) is performed, each support lead includes a third support piece that extends in parallel to the direction of said line, the first end of said first support piece being directly supportingly connected to said third support piece, and the second end of said first support piece being directly supportingly connected to said tie bar portion.

* * * * *